(12) United States Patent
Bae et al.

(10) Patent No.: US 8,698,297 B2
(45) Date of Patent: Apr. 15, 2014

(54) INTEGRATED CIRCUIT PACKAGING SYSTEM WITH STACK DEVICE

(75) Inventors: JoHyun Bae, Seoul (KR); In Sang Yoon, Ichon-si (KR); DaeSik Choi, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

(21) Appl. No.: 13/243,699

(22) Filed: Sep. 23, 2011

(65) Prior Publication Data

US 2013/0075926 A1    Mar. 28, 2013

(51) Int. Cl.
  *H01L 23/02*   (2006.01)
  *H01L 23/08*   (2006.01)
  *H01L 23/52*   (2006.01)
  *H01L 29/40*   (2006.01)

(52) U.S. Cl.
  USPC ............... 257/686; 257/777; 257/E23.085; 257/E25.006; 257/E25.013; 257/E25.018; 257/E25.021; 257/E25.027; 257/E27.137; 257/E27.144; 257/E27.161

(58) Field of Classification Search
  USPC .......... 257/686, E23.085, E25.006, E25.013, 257/E25.018, E25.021, E25.027, E27.137, 257/E27.144, E27.161, 777
  See application file for complete search history.

(56) References Cited

U.S. PATENT DOCUMENTS

| | | | | |
|---|---|---|---|---|
| 6,717,253 B2 * | 4/2004 | Yang | ............... | 257/686 |
| 6,969,914 B2 * | 11/2005 | Fuller et al. | ............... | 257/780 |
| 7,185,426 B1 | 3/2007 | Hiner et al. | | |
| 7,239,164 B2 * | 7/2007 | Tamaki | ............... | 257/686 |
| 7,262,081 B2 * | 8/2007 | Yang et al. | ............... | 438/109 |
| 7,332,801 B2 * | 2/2008 | Low et al. | ............... | 257/686 |
| 7,429,798 B2 * | 9/2008 | Kim | ............... | 257/778 |
| 7,547,978 B2 | 6/2009 | Hembree et al. | | |
| 7,589,408 B2 * | 9/2009 | Weng et al. | ............... | 257/686 |
| 7,608,921 B2 | 10/2009 | Pendse | | |
| 7,777,351 B1 | 8/2010 | Berry et al. | | |
| 7,855,444 B2 * | 12/2010 | Camacho et al. | ............... | 257/686 |
| 7,868,443 B2 * | 1/2011 | Kwon et al. | ............... | 257/686 |
| 7,927,917 B2 | 4/2011 | Pagaila et al. | | |
| 7,968,990 B2 * | 6/2011 | Tanaka et al. | ............... | 257/686 |
| 8,017,437 B2 * | 9/2011 | Yoo et al. | ............... | 438/108 |
| 8,049,119 B2 * | 11/2011 | Beddingfield et al. | ............... | 174/386 |
| 8,067,831 B2 * | 11/2011 | Kwon et al. | ............... | 257/695 |
| 8,110,908 B2 * | 2/2012 | Kim et al. | ............... | 257/686 |
| 8,115,293 B2 * | 2/2012 | Moon et al. | ............... | 257/686 |
| 2006/0208349 A1 * | 9/2006 | Fukuda et al. | ............... | 257/686 |
| 2006/0279315 A1 * | 12/2006 | Takagi et al. | ............... | 324/765 |
| 2007/0117266 A1 * | 5/2007 | Ball | ............... | 438/108 |
| 2007/0262436 A1 * | 11/2007 | Kweon et al. | ............... | 257/686 |
| 2008/0157331 A1 * | 7/2008 | Onodera | ............... | 257/686 |
| 2008/0211084 A1 | 9/2008 | Chow et al. | | |
| 2008/0290505 A1 * | 11/2008 | Kolan et al. | ............... | 257/713 |
| 2009/0057881 A1 * | 3/2009 | Arana et al. | ............... | 257/714 |

(Continued)

FOREIGN PATENT DOCUMENTS

KR    1020090091487 A    8/2009

*Primary Examiner* — Ida M Soward
(74) *Attorney, Agent, or Firm* — Ishimaru & Associates LLP

(57) ABSTRACT

A method of manufacture of an integrated circuit packaging system includes: providing a base substrate; applying a molded under-fill on the base substrate; forming a substrate contact extender through the molded under-fill and in direct contact with the base substrate; mounting a stack device over the molded under-fill; attaching a coupling connector from the substrate contact extender to the stack device; and forming a base encapsulation on the stack device, the substrate contact extender, and encapsulating the coupling connector.

4 Claims, 7 Drawing Sheets

(56) References Cited

U.S. PATENT DOCUMENTS

| | | |
|---|---|---|
| 2009/0140408 A1 | 6/2009 | Lee et al. |
| 2009/0321919 A1 | 12/2009 | Sugino et al. |
| 2010/0102446 A1* | 4/2010 | Katsurayama et al. ....... 257/738 |
| 2010/0214759 A1* | 8/2010 | Beddingfield et al. ........ 361/818 |
| 2010/0258931 A1* | 10/2010 | Yoshida et al. ............... 257/686 |
| 2010/0261311 A1* | 10/2010 | Tsuji ............................. 438/109 |
| 2010/0301466 A1* | 12/2010 | Taoka et al. ................... 257/686 |
| 2011/0001240 A1* | 1/2011 | Merilo et al. ................. 257/738 |
| 2011/0049695 A1* | 3/2011 | Shin et al. ..................... 257/686 |
| 2011/0095439 A1* | 4/2011 | Chin .............................. 257/774 |
| 2011/0111591 A1* | 5/2011 | Do et al. ........................ 438/667 |
| 2011/0147911 A1* | 6/2011 | Kohl et al. .................... 257/686 |
| 2011/0241193 A1* | 10/2011 | Ding et al. .................... 257/686 |
| 2011/0304015 A1* | 12/2011 | Kim et al. ..................... 257/532 |
| 2012/0025398 A1* | 2/2012 | Jang et al. ..................... 257/777 |
| 2012/0074585 A1* | 3/2012 | Koo et al. ..................... 257/774 |
| 2012/0104628 A1* | 5/2012 | Toh et al. ...................... 257/774 |
| 2012/0119388 A1* | 5/2012 | Cho et al. ..................... 257/778 |
| 2012/0205800 A1* | 8/2012 | Shen et al. .................... 257/737 |
| 2012/0208322 A1* | 8/2012 | Okada et al. .................. 438/118 |
| 2013/0070438 A1* | 3/2013 | Choi et al. .................... 361/767 |

* cited by examiner

US 8,698,297 B2

INTEGRATED CIRCUIT PACKAGING SYSTEM WITH STACK DEVICE

CROSS REFERENCE TO RELATED APPLICATION(S)

The present application contains subject matter related to concurrently filed U.S. patent application Ser. No. 13/243,886. The related application is assigned to STATS ChipPAC, Ltd. and the subject matter thereof is incorporated herein by reference thereto.

TECHNICAL FIELD

The present invention relates generally to an integrated circuit packaging system, and more particularly to a package stacking method.

BACKGROUND ART

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages using electrical connections.

Products must compete in world markets and attract many consumers or buyers in order to be successful. It is very important for products to continue to improve in features, performance, and reliability while reducing product costs, product size, and to be available quickly for purchase by the consumers or buyers.

The amount of circuitry and the amount of electrical connections inside a product are key to improving the features, performance, and reliability of any product. Furthermore, the ways the circuitry and electrical connections are implemented can determine the packaging size, packaging methods, and the individual packaging designs.

Attempts have failed to provide a complete solution addressing simplified manufacturing processing, smaller dimensions, lower costs due to design flexibility, increased functionality, leveragability, and increased IO connectivity capabilities.

Thus, a need still remains for an integrated circuit system with improved yield, lower profiles, and improved reliability. In view of the ever-increasing commercial competitive pressures, along with growing consumer expectations and the diminishing opportunities for meaningful product differentiation in the marketplace, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; applying a molded under-fill on the base substrate; forming a substrate contact extender through the molded under-fill and in direct contact with the base substrate; mounting a stack device over the molded under-fill; attaching a coupling connector from the substrate contact extender to the stack device; and forming a base encapsulation on the stack device, the substrate contact extender, and encapsulating the coupling connector.

The present invention provides an integrated circuit packaging system including: a base substrate; a molded under-fill on the base substrate; a substrate contact extender formed through the molded under-fill and in direct contact with the base substrate; a stack device mounted over the molded under-fill; a coupling connector attached from the substrate contact extender to the stack device; and a base encapsulation formed on the stack device, the substrate contact extender, and encapsulating the coupling connector.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
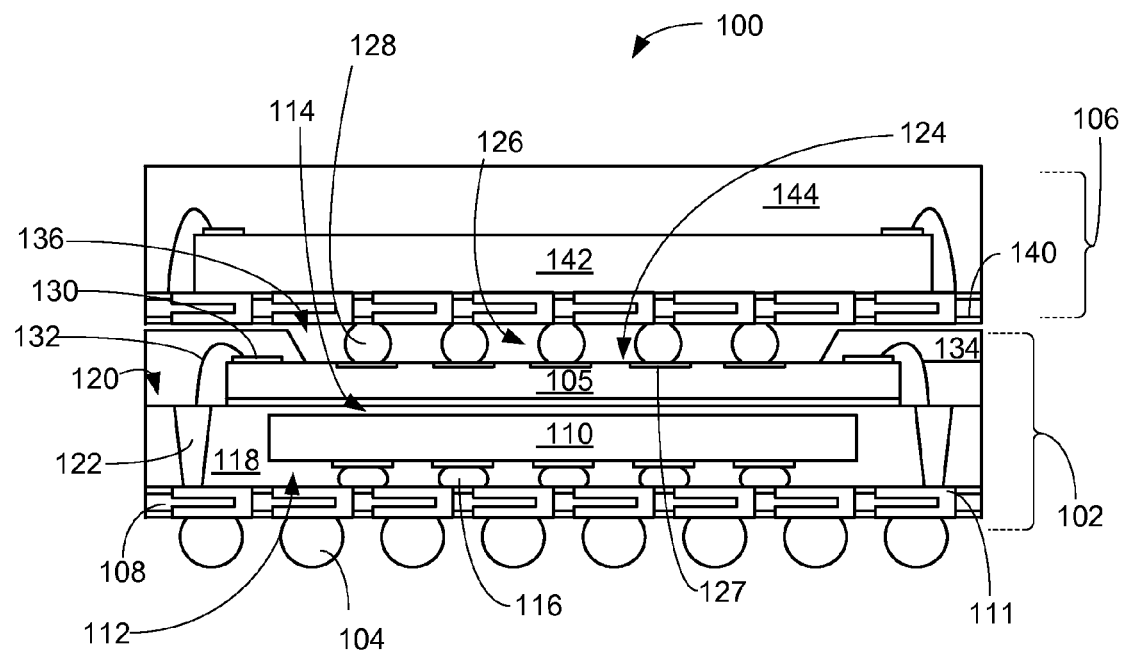
FIG. 1 is a cross-sectional view of an integrated circuit packaging system taken along a line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of the active surface of the integrated circuit, regardless of its orientation. The term "vertical" refers to a direction perpendicular to the horizontal as just defined.

The term "non-horizontal" refers to any angle between horizontal including vertical as previously defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements with no intervening elements in between.

The term "active side" refers to a side of a die, or an electronic structure having active circuitry fabricated thereon. The term "processing" as used herein includes deposition of material or photoresist, patterning, exposure, development, etching, cleaning, and/or removal of the material or photoresist as required in forming a described structure.

Figure 2:
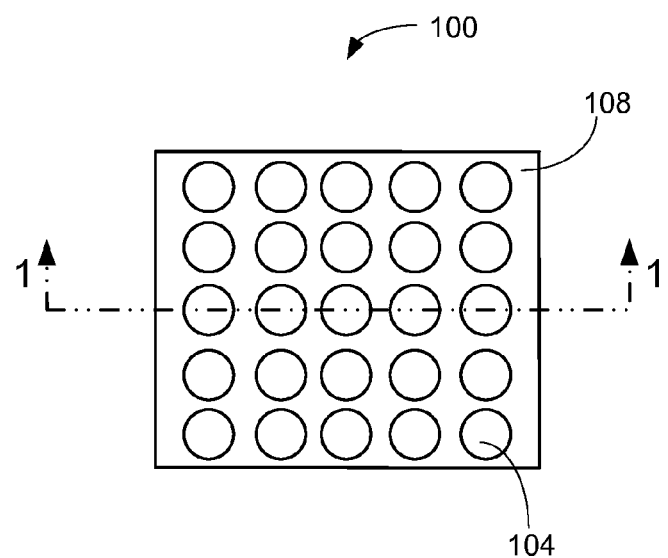
FIG. 2 is a bottom view of the integrated circuit packaging system.

Referring now to FIG. 1, therein is shown a cross-sectional view of an integrated circuit packaging system 100 taken along a line 1-1 of FIG. 2 in a first embodiment of the present invention. The integrated circuit packaging system 100 can include a base package 102, a system interconnect 104, a stack device 105, and a top integrated circuit package 106.

The base package 102 can include a base substrate 108, a base integrated circuit 110, and a base encapsulation 134 for providing structural support and environmental protection for the package.

The base substrate 108 is defined as a structure that provides support and connectivity for other components and devices. The base substrate 108 can include conductive layers and conductive traces embedded therein.

The base integrated circuit 110 is defined as an integrated circuit having active circuitry fabricated thereon. The base integrated circuit 110 can be mounted on the base substrate 108. For illustrative purposes, the base integrated circuit 110 is depicted as a flip-chip although the base integrated circuit 110 can also be a wire-bonded device. The base integrated circuit 110 can have a base active side 112 with active circuitry fabricated thereon and a base inactive side 114 opposite to the base active side 112.

The system interconnect 104 is defined as an electrical connector providing direct electrical and mechanical connection to the next system level (not shown). As an example, the system interconnect 104 can be a solder ball, a solder pillar, or a conductive bump. The system interconnect 104 can be attached to the base substrate 108. The system interconnect 104 can be used to attach the base package 102 to a next level system.

The base substrate 108 can include a substrate component contact 111, which is defined as a conductive structure embedded within the base substrate 108 and exposed from the base substrate 108 on a side opposite to the side attached to the system interconnect 104. The substrate component contact 111 can provide an electrical connection between the system interconnect 104 and components that are mounted over the base substrate 108.

The base package 102 can include a base chip connector 116. The base chip connector 116 is defined as conductive structure for attaching and providing an electrical connection between an integrated circuit and a substrate. As an example, the base chip connector 116 can be solder balls, solder pillars, conductive bumps, or bond wire.

The base package 102 can include a molded under-fill 118, which is defined as a curable liquid under-fill material at room temperature that is cured to form a solid for hermetically sealing components from the environment. For example, the molded under-fill 118 can be a material that is liquid at room temperature and curable by heat or ultra-violet light to form a solid.

The molded under-fill 118 can provide mechanical and environmental protection for the base package 102. The molded under-fill 118 can be formed on and the base substrate 108 and can encapsulate the base active side 112 of the base integrated circuit 110, the vertical sidewalls of the base integrated circuit 110, the base inactive side 114, and the base chip connector 116.

The molded under-fill 118 can include an under-fill top side 120, which is a side of the molded under-fill 118 opposite to the base substrate 108. Other components, encapsulations, and semiconductor devices can be attached to the under-fill top side 120.

The base package 102 can include a substrate contact extender 122, which is defined as a vertical electrical connector. The substrate contact extender 122 can be formed completely through the molded under-fill 118 for providing an electrical connection between the substrate component contact 111 of the base substrate 108 and the under-fill top side 120 of the molded under-fill 118.

The substrate contact extender 122 can be exposed from the molded under-fill 118 at the under-fill top side 120. The substrate contact extender 122 can be formed by forming a hole through the molded under-fill 118 using laser drilling, laser ablation, or etching. The hole formed through the molded under-fill 118 can have a diameter at a top end of 300-600 um and a bottom end with the diameter of 100-300 um. The hole in the molded under-fill 118 is filled with a conductive material to form the substrate contact extender 122.

The substrate contact extender 122 can be spaced apart from another of the substrate contact extender 122 having a pitch between 200-500 um. The substrate contact extender 122 can be formed in a cone shape but the substrate contact extender 122 can also be formed in a cylinder shape.

The stack device 105 is defined as an integrated circuit die or integrated circuit package that is mounted over the molded under-fill 118 and electrically coupled to the substrate contact extender 122. For example, the stack device 105 can be an integrated circuit or a discrete integrated circuit package. The stack device 105 can include a stack top side 124 facing opposite to the base substrate 108. Components, interconnects, substrates, and devices can be mounted on the stack top side 124.

The stack device 105 can include a non-periphery portion 126, which is defined as an interior portion of the surface of the stack top side 124 not including the perimeter of the stack top side 124. The non-periphery portion 126 can be used to mount components, interconnects, substrates, and devices thereon.

The stack device 105 can include a redistribution layer 127 on the stack top side 124 and at the non-periphery portion 126 of the stack device 105. The redistribution layer 127 can provide an electrical connection path along the stack top side 124 and from the top integrated circuit package 106 to the system interconnect 104.

The stack device 105 can include a package interconnect 128, which is defined as a conductive structure mounted on the base package 102 for electrically attaching the base package 102 to another package. The package interconnect 128 can be solder balls, solder dots, solder bumps, wire bonds, or other conductive structures.

The package interconnect 128 can be attached to the non-periphery portion 126 on the redistribution layer 127 for providing an electrical connection between the top integrated circuit package 106 and the stack device 105 or generally to the base package 102.

The stack device 105 can include a stack bond pad 130 on the surface of the stack device 105 for providing an electrical connection with the stack device 105. The stack bond pad 130 can be on the periphery of the top surface of the stack device 105 for attaching a coupling connector 132 thereon.

The base package 102 can include the coupling connector 132, which is defined as a conductive structure for providing an electrical connection. The coupling connector 132 can provide an electrical connection between the substrate contact extender 122 and the stack device 105. The coupling connector 132 can be a wire bond although the coupling connector 132 can also be solder balls, solder dots, solder bumps, solder balls, or other conductive structures.

The coupling connector 132 can be attached to the substrate contact extender 122 and the stack bond pad 130. The coupling connector 132 can provide an electrical connection path between the stack device 105 and the system interconnect 104, the base substrate 108, the base integrated circuit 110, the top integrated circuit package 106, or a combination thereof.

The base package 102 can include a base encapsulation 134. The base encapsulation 134 is defined as a cover for hermetically sealing components from the environment. The base encapsulation 134 can include an epoxy molding compound (EMC), polymide compound, or a wire-in-film (WIF) encapsulation. The base encapsulation 134 is different from the molded under-fill 118 because the base encapsulation 134 is not applied as a liquid at room temperature and then cured to form a solid. The base encapsulation 134 can encapsulate and be on the under-fill top side 120 of the molded under-fill 118, the coupling connector 132, the stack bond pad 130, and a portion of the stack top side 124 where the stack bond pad 130 is located.

The base encapsulation 134 can include a cavity 136 exposing the non-periphery portion 126. The top surface of the base encapsulation 134 can be parallel to the stack top side 124. A sidewall of the cavity 136 can form a non-vertical slope from the top surface of the base encapsulation 134 to the stack top side 124.

The top integrated circuit package 106 is mounted over the base package 102 and can include a top substrate 140, a top integrated circuit 142, and a top encapsulation 144. The top integrated circuit package 106 can be mounted on the package interconnect 128 for attaching the top integrated circuit package 106 to the base package 102.

The top substrate 140 is defined as a structure of a package that provides support and connectivity for other components and devices. The top substrate 140 can include conductive layers and conductive traces embedded therein.

The top integrated circuit package 106 can include a top integrated circuit 142. The top integrated circuit 142 is defined as an integrated circuit having active circuitry fabricated thereon. For illustrative purposes, the top integrated circuit 142 can be a wire-bonded chip although the top integrated circuit 142 can also be a flip chip.

The top encapsulation 144 is defined as is defined as a cover for hermetically sealing components from the environment. The top encapsulation 144 can encapsulate the top integrated circuit 142 on the top substrate 140. The top encapsulation 144 can include an epoxy molding compound (EMC), polymide compound, or a wire-in-film (WIF) encapsulation. The top encapsulation 144 is different from the molded under-fill 118 because the top integrated circuit 142 is not a room temperature liquid when applied to the stack device and cured to form a solid. The top encapsulation 144 can encapsulate the top integrated circuit 142 on the top substrate 140.

It has been discovered that the stack device 105 with the coupling connector 132 attached to the substrate contact extender 122 formed through the molded under-fill 118 provides the benefit of direct stacking without a further solder bump level which reduces package profile and process steps. The stack device 105 can be directly mounted to the molded under-fill 118 for a lower package profile. The coupling connector 132 and the substrate contact extender 122 provide a direct and low profile electrical connection between the base substrate 108 and the stack top side 124 of the stack device 105.

Further, it has been discovered that the stack device 105 coupled to the substrate contact extender 122 by the coupling connector 132 provides for interchangeable packages to be mounted to the base package 102. The placement of the substrate contact extender 122 and the coupling connector 132 make various package-on-package, Fan-in package-on-package, and package-in-package structures available without making changes to the base package 102. For example, the base encapsulation 134 can encapsulate the stack device 105 with the non-periphery portion 126 of the stack device 105 exposed for fabricating a Fan-in package-in-package structure.

Further, it has been discovered that the placement of the package interconnect 128 on the non-periphery portion 126 of the stack device 105 can reduce warpage between the base package 102 and the top integrated circuit package 106 and reduces the effect of the coefficient of thermal expansion on the package interconnect 128.

Referring now to FIG. 2, therein is shown a bottom view of the integrated circuit packaging system 100. The integrated circuit packaging system 100 can include the base substrate 108 and the system interconnect 104. For illustrative purposes, the system interconnect 104 is shown with a fully populated array although it is understood that the system interconnect 104 can be arranged in other array configurations. For example, the array for the system interconnect 104 can be a five by five array, an array with fewer number of the system interconnect 104, or an array with a larger number of the system interconnect 104.

Figure 3:
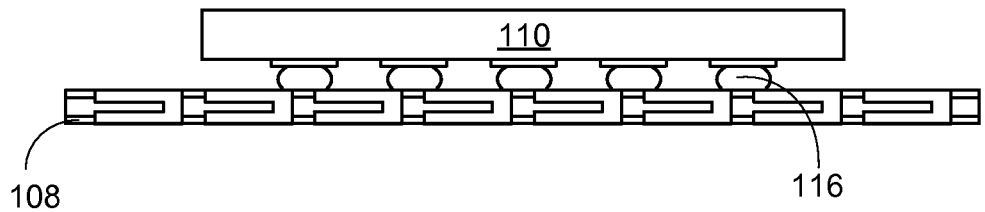
FIG. 3 is the cross-sectional view of the base package in the base integrated circuit attachment phase.

Referring now to FIG. 3, therein is shown the cross-sectional view of the base package 102 in the base integrated circuit 110 attachment phase. The phase depicts the base substrate 108, the base integrated circuit 110, and the base chip connector 116.

The base integrated circuit 110 with the base chip connector 116 is mounted to the base substrate 108. For clarity of explanation, the base integrated circuit 110 is depicted as a flip chip but the base integrated circuit 110 can be a wire-bonded device mounted to the base substrate 108 with an adhesive layer.

It is understood that while only a single unit of the base substrate 108 is shown for clarity, in production a substrate sheet can be used to produce multiple units of the base package 102, of FIG. 1. It is further understood that a singulation process would be used to separate the individual instances of the base package 102 after the assembly process is completed.

Figure 4:
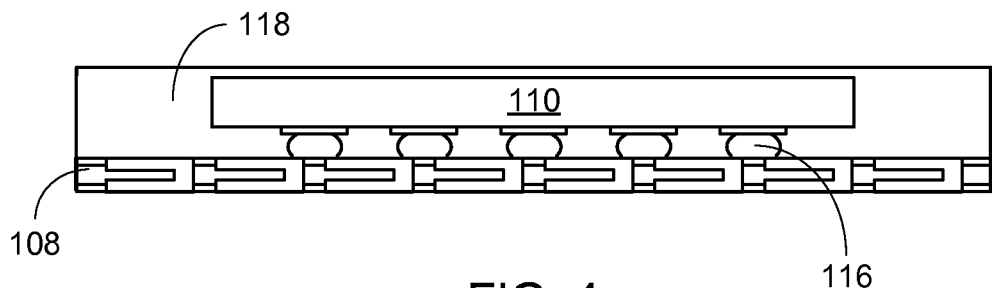
FIG. 4 is the structure of FIG. 3 in the molded under-fill application phase.

Referring now to FIG. 4, therein is shown the structure of FIG. 3 in the molded under-fill 118 application phase. The phase depicts the base substrate 108, the base integrated circuit 110, the base chip connector 116, and the molded under-fill 118.

The molded under-fill 118 can encapsulate the base chip connector 116, the base inactive side 114, and between the base active side 112 and the base substrate 108. The molded under-fill 118 can also encapsulate the vertical sidewalls along the perimeter of the base integrated circuit 110.

The molded under-fill 118 can be formed using a mold chase and injecting the molded under-fill 118 between the mold chase and the base substrate 108. The molded under-fill 118 can be cured to encapsulate the base integrated circuit 110.

Figure 5:
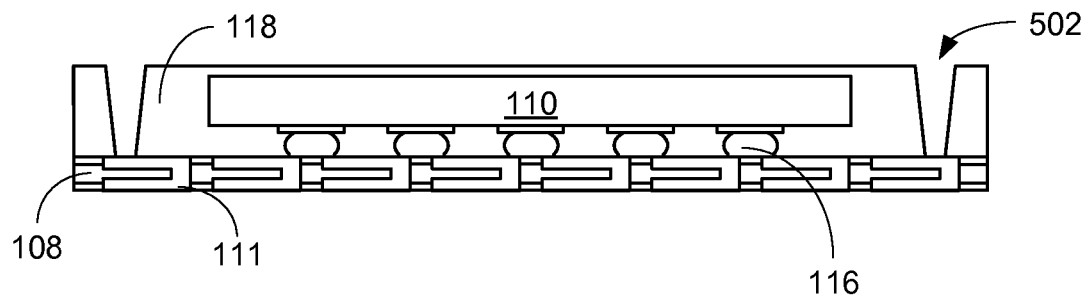
FIG. 5 is the structure of FIG. 4 in a hole formation phase.

Referring now to FIG. 5, therein is shown the structure of FIG. 4 in a hole formation phase. The phase depicts the base substrate 108, the base integrated circuit 110, the base chip connector 116, and the molded under-fill 118.

A hole 502 can be formed through the molded under-fill 118 using laser drilling, laser ablation, or etching. The hole 502 can completely pass through the molded under-fill 118 to expose the substrate component contact 111 from the molded under-fill 118. The hole formed through the molded under-fill 118 can have a diameter at a top end of 300-600 um and a bottom end with the diameter of 100-300 um.

The hole 502 can have a conical shape with the wider end of the hole 502 spaced away from the base substrate 108. For example, the conical shape of the hole 502 can be formed by positioning the laser to different inclined angles during laser ablation to form the hole 502. The hole 502 can also be formed having a cylinder shape.

Figure 6:
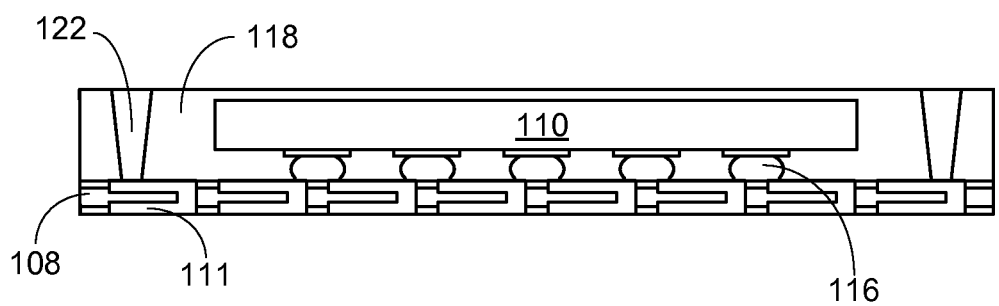
FIG. 6 is the structure of FIG. 5 in the substrate contact extender forming phase.

Referring now to FIG. 6, therein is shown the structure of FIG. 5 in the substrate contact extender 122 forming phase. The phase depicts the base substrate 108, the base integrated circuit 110, the base chip connector 116, the molded under-fill 118, and the substrate component contact 111.

The substrate contact extender 122 can be formed by forming conductive material into the hole 502 of FIG. 5. The conductive material can be conductive metal or alloy for providing an electrical pathway. For example, the conductive substance of the conductive material can include solder, aluminum, copper, or other conductive materials.

The substrate contact extender 122 that is formed can provide a vertical electrical connector passing completely through the molded under-fill 118. The top end of the substrate contact extender 122 can be exposed from the molded under-fill 118 at the under-fill top side 120.

The substrate contact extender 122 can be formed in the hole 502 by employing a number of different processes. For example, the substrate contact extender 122 can be formed with chemical vapor deposition (CVD) process, silk screening process, or a plating process. The conductive material within the hole 502 forms the substrate contact extender 122 of FIG. 1.

Figure 7:
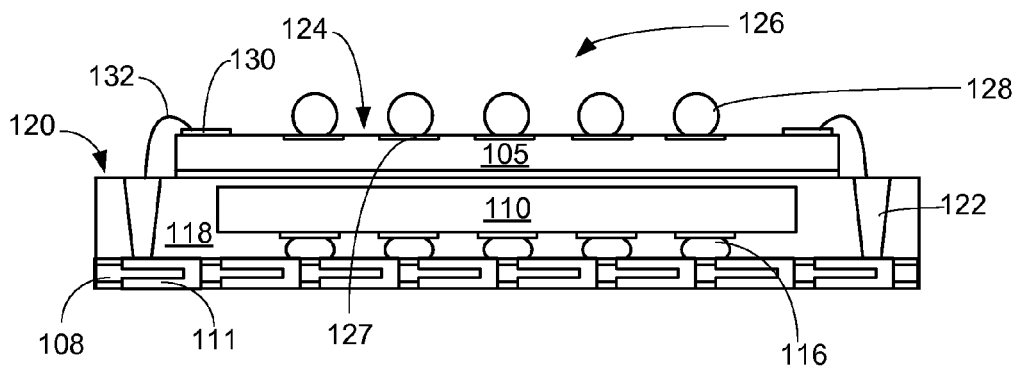
FIG. 7 is the structure of FIG. 6 in a wire bonding phase.

Referring now to FIG. 7, therein is shown the structure of FIG. 6 in the stack device 105 attachment and wire bonding phase. The phase depicts the base substrate 108, the base integrated circuit 110, the substrate component contact 111, the base chip connector 116, the molded under-fill 118, the substrate contact extender 122, the stack device 105, the stack bond pad 130, and the package interconnect 128.

The stack device 105, such as a redistribution layer die, flip chip integrated circuit, or a wire-bonded die with the redistribution layer 127 over its active surface, can be mounted to the under-fill top side 120. The stack device 105 can include the stack bond pad 130 on a periphery of the stack top side 124 of the stack device 105 and the redistribution layer 127 along the non-periphery portion 126. The package interconnect 128 can be electrically attached to the stack device 105 to the redistribution layer 127.

The coupling connector 132 can be attached between the substrate contact extender 122 and the stack device 105 for providing an electrical connection. The coupling connector 132 can be attached to a top surface of the substrate contact extender 122 that is exposed from the molded under-fill 118.

The coupling connector 132 can be electrically connected to the stack bond pad 130 on the stack device 105. For example, the coupling connector 132 can be a bond wire connecting the substrate contact extender 122 to the stack bond pad 130.

Figure 8:
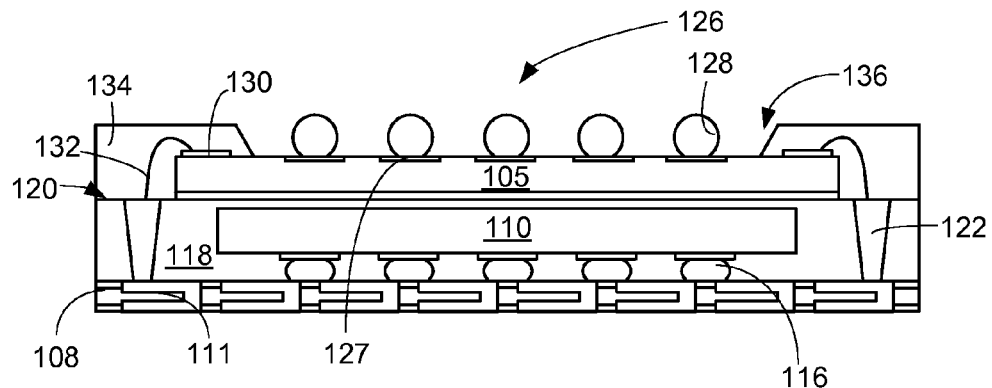
FIG. 8 is the structure of FIG. 7 in an encapsulation phase.

Referring now to FIG. 8, therein is shown the structure of FIG. 7 in an encapsulation phase. The phase depicts the base substrate 108, the base integrated circuit 110, the base chip connector 116, the molded under-fill 118, the substrate component contact 111, the substrate contact extender 122, the stack device 105, the redistribution layer 127, the package interconnect 128, the coupling connector 132, and the base encapsulation 134.

The base encapsulation 134 can encapsulate the under-fill top side 120 of the molded under-fill 118, the coupling connector 132, the stack bond pad 130, and a portion of the stack device 105. The base encapsulation 134 can include the cavity 136 for exposing the non-periphery portion 126. The base encapsulation 134 does not encapsulate the package interconnect 128, which are positioned in the exposed portion of the non-periphery portion 126. The package interconnects 128 are taller than the base encapsulation 134 that surrounds the non-periphery portion 126 for providing clearance between packages.

The base encapsulation 134 can include an epoxy molding compound (EMC), polymide compound, or a wire-in-film (WIF) encapsulation. The base package 102 can be encapsulated by the base encapsulation 134 using a transfer method, mold chase, filling, depositing, wire-in-film pressing, or a combination thereof.

Figure 9:
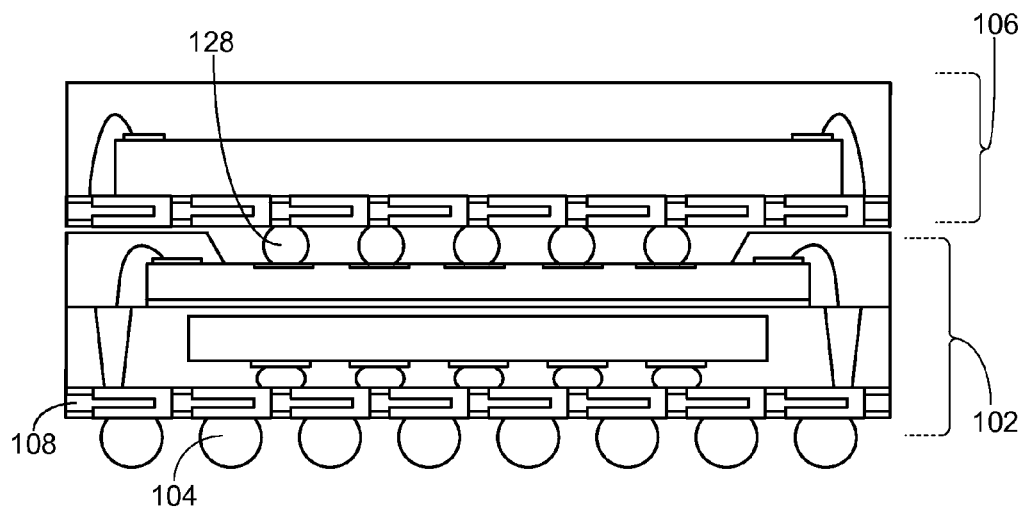
FIG. 9 is the structure of FIG. 8 in the top integrated circuit package attachment phase.

Referring now to FIG. 9, therein is shown the structure of FIG. 8 in the top integrated circuit package 106 attachment phase. The top integrated circuit package 106 can be mounted to the package interconnect 128 for mounting the top integrated circuit package 106 to the base package 102.

The system interconnect 104 can be attached to the base substrate 108. The base package 102, the top integrated circuit package 106, and the system interconnect 104 together form the integrated circuit packaging system 100 as shown in FIG. 1.

Figure 10:
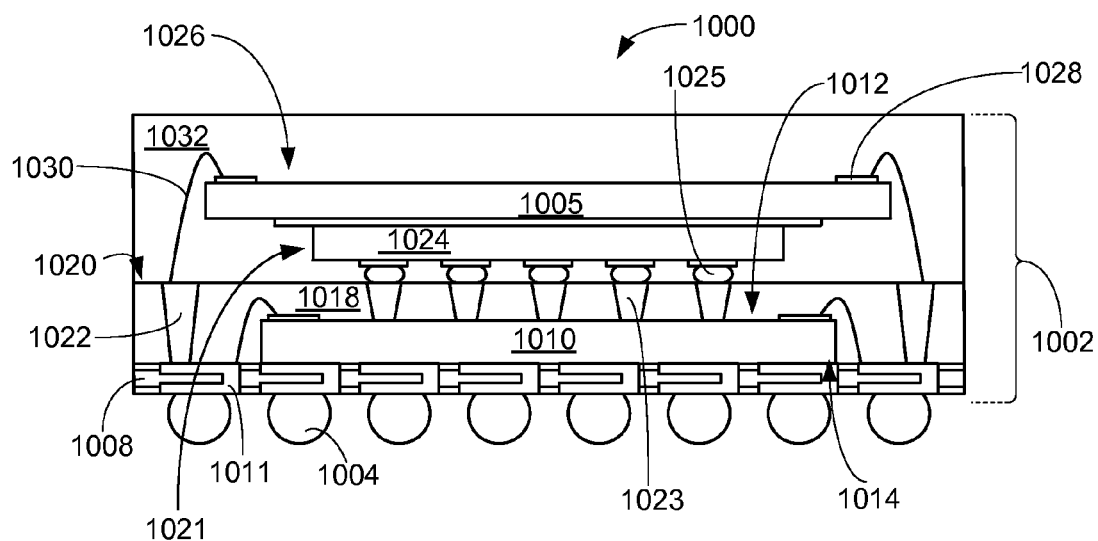
FIG. 10 is a cross-sectional view of an integrated circuit packaging system exemplified by the bottom view along line 1-1 of FIG. 2 in a second embodiment of the present invention.

Referring now to FIG. 10, therein is shown a cross-sectional view of an integrated circuit packaging system 1000 exemplified by the bottom view along line 1-1 of FIG. 2 in a second embodiment of the present invention. The integrated circuit packaging system 1000 can be similar to the integrated circuit packaging system 100 of FIG. 1 except the integrated circuit packaging system 1000 includes a package-in-package configuration instead of a separate discreet top package.

A base package 1002 can include a base substrate 1008, a base integrated circuit 1010, and an encapsulation for providing structural support and environmental protection for the package.

The base substrate 1008 is defined as a structure that provides support and connectivity for other components and devices. The base substrate 1008 can include conductive layers and conductive traces embedded therein.

The base integrated circuit 1010 is defined as an integrated circuit having active circuitry fabricated thereon. For illustrative purposes, the base integrated circuit 1010 can be a wire-bonded chip although the base integrated circuit 1010 can also be a flip chip. The base integrated circuit 1010 can be mounted to the base substrate 1008 using an adhesive layer. The base integrated circuit 1010 can have a base active side 1012, with active circuitry fabricated thereon, and a base inactive side 1014 opposite to the base active side 1012.

A system interconnect 1004 is defined as an electrical connector providing direct electrical and mechanical connection to the next system level (not shown). As an example, the system interconnect 1004 can be a solder ball, a solder pillar, or a conductive bump. The system interconnect 1004 can be attached to the base substrate 1008. The system interconnect 1004 can be used to attach the base package 1002 to a next level system.

The base substrate 1008 can include a substrate component contact 1011, which is defined as a conductive structure embedded within the base substrate 1008 and exposed from the base substrate 1008 on a side opposite to the side attached to the system interconnect 1004. The substrate component contact 1011 can provide an electrical connection between the system interconnect 1004 and components that are mounted over the base substrate 1008.

The base package 1002 can include a molded under-fill 1018, which is defined as a curable liquid under-fill material at room temperature that is cured to form a solid for hermetically sealing integrated circuits and semiconductor structures. For example, the molded under-fill 1018 can be a material that is liquid at room temperature and curable by heat or ultra-violet light to form a solid.

The molded under-fill 1018 can provide mechanical and environmental protection for the base package 1002. The molded under-fill 1018 can encapsulate the base active side 1012 of the base integrated circuit 1010, the vertical sidewalls of the base integrated circuit 1010, and a periphery portion of the side of the base substrate 1008 opposite to the system interconnect 1004.

The molded under-fill 1018 can include an under-fill top side 1020, which is a side of the molded under-fill 1018 opposite to the base substrate 1008. Other components, encapsulations, and semiconductor devices can be mounted on the under-fill top side 1020.

The base package 1002 can include a substrate contact extender 1022, which is defined as a vertical electrical connector. The substrate contact extender 1022 can be formed completely through the molded under-fill 1018 for providing an electrical connection between the substrate component contact 1011 of the base substrate 1008 and the under-fill top side 1020 of the molded under-fill 1018.

The substrate contact extender 1022 can be formed by forming a hole through the molded under-fill 1018 using laser drilling, laser ablation, or etching. The hole formed through the molded under-fill 1018 can have a diameter at a top end of 300-600 um and a bottom end with the diameter of 100-300 um.

The hole in the molded under-fill 1018 is filled with a conductive material to form the substrate contact extender 1022. The substrate contact extender 1022 can be exposed from the molded under-fill 1018 at the under-fill top side 1020. The substrate contact extender 1022 can be formed in a cone shape but the substrate contact extender 1022 can also be formed in a cylinder shape.

The base package 1002 can include a chip contact extender 1023, which is defined as a vertical electrical connector. The chip contact extender 1023 can be formed completely through the molded under-fill 1018 for providing an electrical connection between the base integrated circuit 1010 and the under-fill top side 1020 of the molded under-fill 1018.

The chip contact extender 1023 can be formed by forming a hole through the molded under-fill 1018 using laser drilling, laser ablation, or etching. The hole formed through the molded under-fill 1018 can have a diameter at a top end of 300-600 um and a bottom end with the diameter of 100-300 um.

The hole in the molded under-fill 1018 is filled with a conductive material to form the chip contact extender 1023. The chip contact extender 1023 can be exposed from the molded under-fill 1018 at the under-fill top side 1020. The chip contact extender 1023 can be formed on a non-periphery area of the base active side 1012 of the base integrated circuit 1010.

The chip contact extender 1023 can be spaced apart from another of the chip contact extender 1023 having a pitch between 200-500 um. The chip contact extender 1023 can be formed in a cone shape but the chip contact extender 1023 can also be formed in a cylinder shape.

The base package 1002 can include an intermediate integrated circuit 1021, which is defined as an integrated circuit having active circuitry fabricated thereon. The intermediate integrated circuit 1021 can be mounted on the base package 1002 and can have another package mounted thereover.

The intermediate integrated circuit 1021 can be an intermediate flip chip 1024 mounted on the chip contact extender 1023. The intermediate flip chip 1024 can include an intermediate interconnect 1025, which is defined as an electrical connector for connecting the intermediate flip chip 1024 to the base integrated circuit 1010. The intermediate interconnect 1025 can be a solder ball, a solder dot, a solder bump, or other conductive structure. The intermediate interconnect 1025 can be formed between the chip contact extender 1023 and an active side of the intermediate flip chip 1024.

A stack device 1005 is defined as an integrated circuit die or integrated circuit package for mounting over the base package 1002. The stack device 1005 can be mounted on the molded under-fill 1018 and electrically coupled to the substrate contact extender 1022. The stack device 1005 can be a wire-bonded integrated circuit. The stack device 1005 can be mounted over the intermediate flip chip 1024 with an adhesive layer.

The stack device 1005 can include a stack top side 1026 at a side of the stack device 1005 facing opposite to the base substrate 1008. Components, interconnects, substrates, and devices can be mounted on the stack top side 1026.

The stack device 1005 can include a stack bond pad 1028 on the stack top side 1026 of the stack device 1005. The stack bond pad 1028 can be on a periphery of the stack top side 1026 for connecting a coupling connector 1030 thereon.

The base package 1002 can include the coupling connector 1030, which is defined as a conductive structure for providing an electrical connection between the substrate contact extender 1022 and the stack device 1005. The coupling connector 1030 can be a wire bond although the coupling connector 1030 can also be a solder ball, a solder dot, a solder bump, or other conductive structure.

The coupling connector 1030 can be attached from the substrate contact extender 1022 to the stack bond pad 1028. The coupling connector 1030 can provide an electrical connection path between the stack device 1005 and the system interconnect 1004, the base substrate 1008, the base integrated circuit 1010, the intermediate flip chip 1024 or a combination thereof.

The base package 1002 can include a base encapsulation 1032, which is defined as a cover for hermetically sealing components of the base package 1002. The base encapsulation 1032 can include an epoxy molding compound (EMC), polymide compound, or a wire-in-film (WIF) encapsulation. The base encapsulation 1032 is different from the molded under-fill 1018 because the base encapsulation 1032 is not a room temperature liquid when applied to the stack device and cured to form a solid.

The base encapsulation 1032 can encapsulate the under-fill top side 1020 of the molded under-fill 1018, the coupling connector 1030, the intermediate flip chip 1024, the intermediate interconnect 1025, the stack bond pad 1028, and the stack device 1005. The base encapsulation 1032 with the stack device 1005 over the molded under-fill 1018 forms a package-in-package structure.

It has been discovered that the stack device 1005 with the coupling connector 1030 attached to the substrate contact extender 1022 formed through the molded under-fill 1018 provides the benefit of direct stacking without a further solder bump level which reduces package profile and process steps. The stack device 1005 can be directly mounted to the molded under-fill 1018 for a lower package profile. The coupling connector 1030 and the substrate contact extender 1022 provide a direct and low profile electrical connection between the base substrate 1008 and a top side of the stack device 1005.

Further, it has been discovered that the stack device 1005 coupled to the substrate contact extender 1022 by the coupling connector 1030 provides for interchangeable packages to be mounted to the base package 1002. The placement of the substrate contact extender 1022 and the coupling connector 1030 make various package-on-package, Fan-in package-on-package, and package-in-package structures available. For example, the base encapsulation 1032 can encapsulate the stack device 1005 mounted on the molded under-fill 1018 for fabricating a package-in-package structure.

Figure 11:
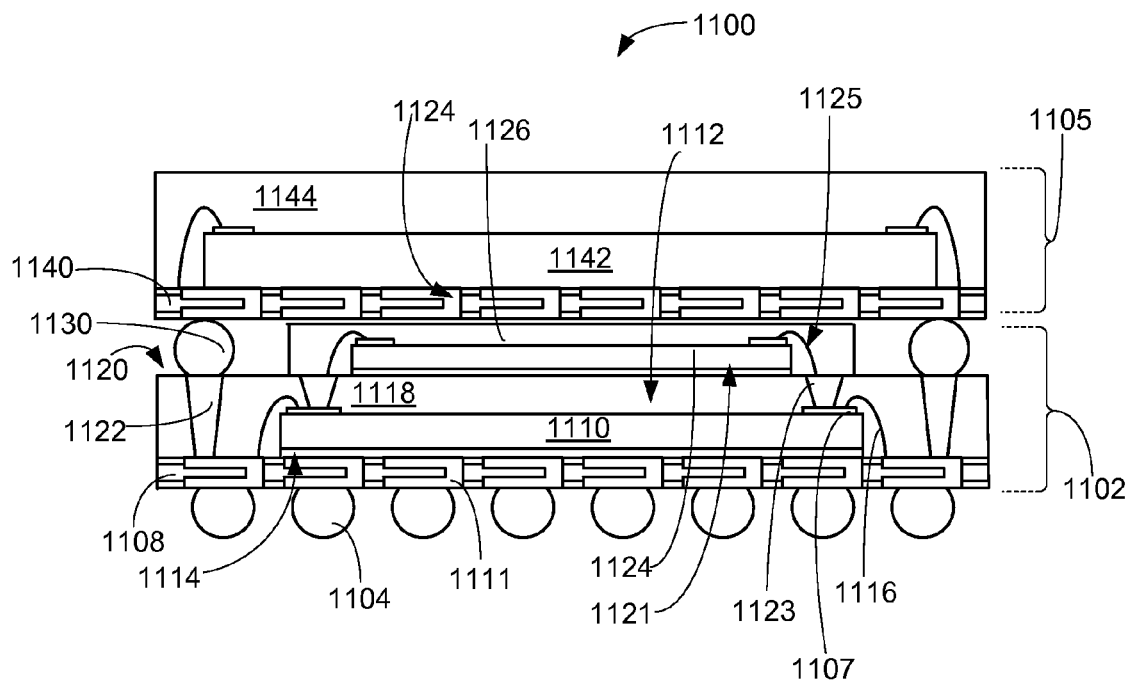
FIG. 11 is a cross-sectional view of an integrated circuit packaging system exemplified by the bottom view along line 1-1 of FIG. 2 in a third embodiment of the present invention.

Referring now to FIG. 11, therein is shown a cross-sectional view of an integrated circuit packaging system 1100 exemplified by the bottom view along line 1-1 of FIG. 2 in a third embodiment of the present invention. The integrated circuit packaging system 1100 can be similar to the integrated circuit packaging system 100 of FIG. 1 except the integrated circuit packaging system 1100 can include a stack device 1105 as a top integrated circuit package.

A base package 1102 can include a base substrate 1108, a base integrated circuit 1110, and an encapsulation for providing structural support and environmental protection for the package integrated circuit.

The base substrate 1108 is defined as a structure that provides support and connectivity for other components and devices. The base substrate 1108 can include conductive layers and conductive traces embedded therein.

The base integrated circuit 1110 is defined as an integrated circuit having active circuitry fabricated thereon. For illustrative purposes, the base integrated circuit 1110 can be a wire-bonded device although the base integrated circuit 1110 can also be a flip chip. The base integrated circuit 1110 can have a base active side 1112 with active circuitry fabricated thereon and a base inactive side 1114 opposite to the base active side 1112.

The base integrated circuit 1110 can include a base bond pad 1107. The base bond pad 1107 can be on the periphery of the base active side 1112. Wire bonds and other conductive structures can be attached to the base bond pad 1107 for forming an electrical connection path to the base integrated circuit 1110.

A system interconnect 1104 is defined as an electrical connector providing direct electrical and mechanical connection to the next system level (not shown). As an example, the system interconnect 1104 can be a solder ball, a solder pillar, or a conductive bump. The system interconnect 1104 can be attached to the base substrate 1108. The system interconnect 1104 can be used to attach the base package 1102 to a next level system.

The base substrate 1108 can include a substrate component contact 1111, which is defined as a conductive structure embedded within the base substrate 1108 and exposed from the base substrate 1108 on a side opposite to the side attached to the system interconnect 1104. The substrate component contact 1111 can provide an electrical connection between the system interconnect 1104 and components that are mounted over the base substrate 1108.

The base package 1102 can include a base chip connector 1116. The base chip connector 1116 is defined as conductive structure for attaching and providing an electrical connection between an integrated circuit and a substrate. The base chip connector 1116 can be a wire bond attached from the base substrate 1108 to the base active side 1112.

The base package 1102 can include a molded under-fill 1118, which is defined as a curable liquid under-fill material at room temperature that is cured to form a solid for hermetically sealing components from the environment. For example, the molded under-fill 1118 can be a material that is liquid at room temperature and curable by heat or ultra-violet light to form a solid.

The molded under-fill 1118 can provide mechanical and environmental protection for the base package 1102. The molded under-fill 1118 can be formed on a side of the base substrate 1108 opposite to the system interconnect 1104 and can encapsulate the base active side 1112 of the base integrated circuit 1110, and the vertical sidewalls of the base integrated circuit 1110.

The molded under-fill 1118 can include an under-fill top side 1120 at a side of the molded under-fill 1118 opposite to the base substrate 1108. Other components, encapsulations, and semiconductor devices can be mounted to the under-fill top side 1120.

The base package 1102 can include a substrate contact extender 1122, which is defined as a vertical electrical connector. The substrate contact extender 1122 can be formed completely through the molded under-fill 1118 for providing an electrical connection between the substrate component contact 1111 of the base substrate 1108 and the under-fill top side 1120 of the molded under-fill 1118.

The substrate contact extender 1122 can be formed by forming a hole through the molded under-fill 1118 using laser drilling, laser ablation, or etching. The hole formed through the molded under-fill 1118 can have a diameter at a top end of 300-600 um and a bottom end with the diameter of 100-300 um.

The hole in the molded under-fill 1118 is filled with a conductive material to form the substrate contact extender 1122. The substrate contact extender 1122 can be exposed from the molded under-fill 1118 at the under-fill top side 1120. The substrate contact extender 1122 can be formed in a cone shape but the substrate contact extender 1122 can also be formed in a cylinder shape.

The base package 1102 can include a chip contact extender 1123, which is defined as a vertical electrical connector. The chip contact extender 1123 can be formed completely through the molded under-fill 1118 for providing an electrical connection between the base integrated circuit 1110 and the under-fill top side 1120 of the molded under-fill 1118. The chip contact extender 1123 can be formed on the base bond pad 1107.

The chip contact extender 1123 can be formed by forming a hole through the molded under-fill 1118 using laser drilling, laser ablation, or etching. The hole formed through the molded under-fill 1118 can have a diameter at a top end of 300-600 um and a bottom end with the diameter of 100-300 um.

The hole in the molded under-fill 1118 is filled with a conductive material to form the substrate contact extender 1122. The chip contact extender 1123 can be exposed from the molded under-fill 1118 at the under-fill top side 1120.

The chip contact extender 1123 can be formed on a periphery of the base active side 1112 of the base integrated circuit 1110. The chip contact extender 1123 can be formed in a cone shape but the chip contact extender 1123 can also be formed in a cylinder shape.

The base package 1102 can include an intermediate integrated circuit 1121, which is defined as an integrated circuit having active circuitry fabricated thereon. The intermediate integrated circuit 1121 can be mounted on the base package 1102 and can have another package mounted thereover.

The intermediate integrated circuit 1121 can be an intermediate wire-bonded chip 1124 mounted over the chip contact extender 1123. The intermediate wire-bonded chip 1124 can include an intermediate interconnect 1125, which is defined as an electrical connector for connecting the intermediate wire-bonded chip 1124 to the base integrated circuit 1110. The intermediate interconnect 1125 can be a wire bond. The intermediate interconnect 1125 can be attached from the chip contact extender 1123 to a contact pad on an active side of the intermediate wire-bonded chip 1124.

The base package 1102 can include an intermediate encapsulation 1126 for encapsulating the intermediate wire-bonded chip 1124. The intermediate encapsulation 1126 is defined as a cover for hermetically sealing components from the environment. The intermediate encapsulation 1126 can include an epoxy molding compound (EMC), polymide compound, or a wire-in-film (WIF) encapsulation. The intermediate encapsulation 1126 is different from the molded under-fill 1118 because the intermediate encapsulation 1126 is not a room temperature liquid when applied to the stack device 1105 and cured to form a solid. The intermediate encapsulation 1126 can encapsulate a non-periphery portion of the under-fill top side 1120, a top surface of the chip contact extender 1123, the intermediate interconnect 1125, and the intermediate wire-bonded chip 1124.

A coupling connector 1130 is defined as a conductive structure for providing an electrical connection. The coupling connector 1130 can provide an electrical connection between the stack device 1105 to the substrate contact extender 1122. The coupling connector 1130 can be a solder ball, a solder dot, a solder bump, or other conductive structure.

The coupling connector 1130 can provide an electrical connection path between the stack device 1105 and the system interconnect 1104, the base substrate 1108, the base integrated circuit 1110, the intermediate wire-bonded chip 1124, a stack integrated circuit 1142, or a combination thereof. The height of the coupling connector 1130 provides a separation between the top side of the intermediate encapsulation 1126 and a stack substrate 1140.

The stack device 1105 is defined as integrated circuit package or integrated circuit die that is mounted over the base package 1102. The stack device 1105 can be a separate discreet integrated circuit package including the stack substrate 1140, the stack integrated circuit 1142, and a stack encapsulation 1144. The stack device 1105 can be mounted on the coupling connector 1130 for attaching the stack device 1105 to the base package 1102. The stack device 1105 can be suspended over the intermediate encapsulation 1126 because the coupling connector 1130 provides a clearance space between the stack device 1105 and the intermediate encapsulation 1126.

The stack substrate 1140 provides support and connectivity for other components and devices. The stack substrate 1140 can include conductive layers and conductive traces embedded therein. The stack substrate 1140 can be mounted on the coupling connector 1130.

The stack integrated circuit 1142 is mounted over the stack substrate 1140. For illustrative purposes, the stack integrated circuit 1142 can be a wire-bonded chip although the stack integrated circuit 1142 can also be a flip chip. The stack integrated circuit 1142 can be mounted on the stack substrate 1140 by an adhesive layer. The stack integrated circuit 1142 can be electrically coupled to the stack substrate 1140 by a bond wire.

The stack device 1105 can include the stack encapsulation 1144, which is defined as a cover for hermetically sealing components from the environment. The stack encapsulation 1144 can include an epoxy molding compound (EMC), polymide compound, or a wire-in-film (WIF) encapsulation. The stack encapsulation 1144 is different from the molded under-fill because the base encapsulation 134 is not liquid at room temperature when applied to the stack device 1105 and cured to form a solid. The stack encapsulation 1144 can encapsulate the stack integrated circuit 1142 on the stack substrate 1140.

It has been discovered that the intermediate wire-bonded chip 1124 mounted on the molded under-fill 1118 and the chip contact extender 1123 coupled to the active side of the intermediate wire-bonded chip 1124 provides the benefit of direct stacking without a further solder bump level which reduces package profile and process steps. The intermediate wire-bonded chip 1124 can be directly mounted to the molded under-fill 1118 without the need of solder balls in-between for a lower package profile.

Further, it has been discovered that the stack device 1105 with the coupling connector 1130 attached to the substrate contact extender 1122 formed through the molded under-fill 1118 provides for interchangeable packages to be mounted to the base package 1102. The placement of the substrate contact extender 1122 and the coupling connector 1130 make various package-on-package, Fan-in package-on-package, and package-in-package structures available without making changes to the base package 1102. For example, the stack device 1105, such as a top integrated circuit package can be mounted on the coupling connector 1130 for fabricating a package-on-package structure.

Figure 12:
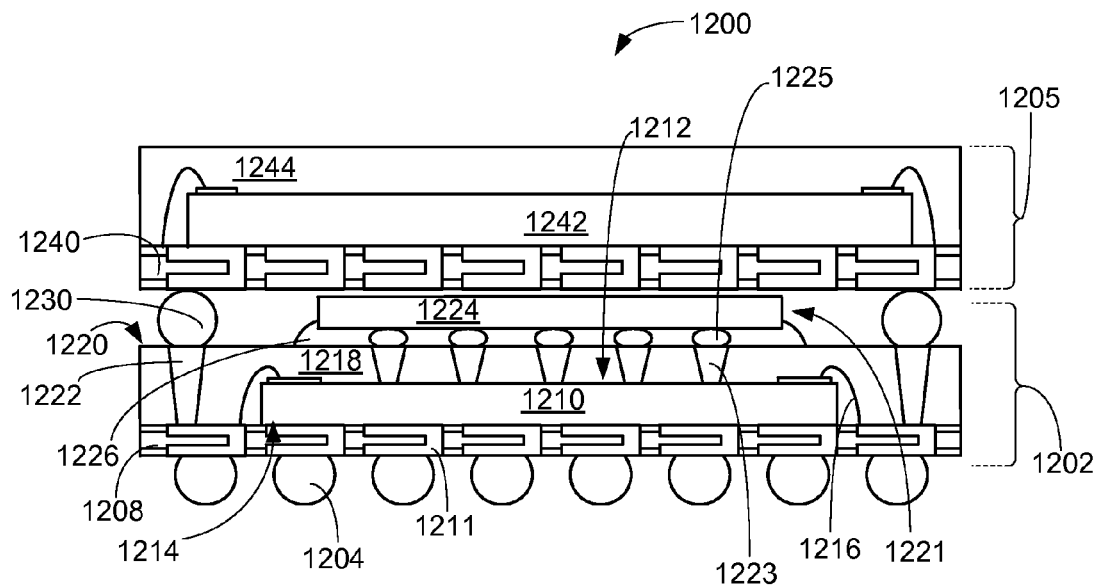
FIG. 12 is a cross-sectional view of an integrated circuit packaging system exemplified by the bottom view along line 1-1 of FIG. 2 in a fourth embodiment of the present invention.

Referring now to FIG. 12, therein is shown a cross-sectional view of an integrated circuit packaging system 1200 exemplified by the bottom view along line 1-1 of FIG. 2 in a fourth embodiment of the present invention. The integrated circuit packaging system 1200 can be similar to the integrated circuit packaging system 1100 of FIG. 11 except the integrated circuit packaging system 1200 includes a flip chip instead of the intermediate wire-bonded chip 1124 of FIG. 11.

A base package 1202 can include a base substrate 1208, a base integrated circuit 1210, and an encapsulation for providing structural support and environmental protection for the package integrated circuit.

The base substrate 1208 is defined as a structure that provides support and connectivity for other components and devices. The base substrate 1208 can include conductive layers and conductive traces embedded therein.

The base integrated circuit 1210 is defined as an integrated circuit having active circuitry fabricated thereon. For illustrative purposes, the base integrated circuit 1210 can be a wire-bonded device although the base integrated circuit 1210 can also be a flip chip. The base integrated circuit 1210 can have a base active side 1212 with active circuitry fabricated thereon and a base inactive side 1214 opposite to the base active side 1212.

The base integrated circuit 1210 can include a base bond pad 1207. The base bond pad 1207 can be on the perimeter of the base active side 1212. Wire bonds and other conductive structures can be attached to the base bond pad 1207 for forming an electrical connection path to the base integrated circuit 1210.

A system interconnect 1204 is defined as an electrical connector providing direct electrical and mechanical connection to the next system level (not shown). As an example, the system interconnect 1204 can be a solder ball, a solder pillar, or a conductive bump. The system interconnect 1204 can be attached to the base substrate 1208. The system interconnect 1204 can be used to attach the base package 1202 to a next level system.

The base substrate 1208 can include a substrate component contact 1211, which is defined as a conductive structure embedded within the base substrate 1208 and exposed from the base substrate 1208 on a side opposite to the side attached to the system interconnect 1204. The substrate component contact 1211 can provide an electrical connection between the system interconnect 1204 and components that are mounted over the base substrate 1208.

The base package 1202 can include a base chip connector 1216. The base chip connector 1216 is defined as conductive structure for connecting the base integrated circuit 1210 to the base substrate 1208. The base chip connector 1216 can be a wire bond.

The base package 1202 can include a molded under-fill 1218, which is defined as a curable liquid under-fill material at room temperature that is cured to form a solid for hermetically sealing integrated circuits and semiconductor structures. For example, the molded under-fill 1218 can be a material that is liquid at room temperature and curable by heat or ultra-violet light to form a solid.

The molded under-fill 1218 can provide mechanical and environmental protection for the base package 1202. The molded under-fill 1218 can be formed on a side of the base substrate 1208 opposite to the system interconnect 1204 and encapsulate the base active side 1212 of the base integrated circuit 1210, and the vertical sidewalls of the base integrated circuit 1210.

The molded under-fill 1218 can include an under-fill top side 1220, which is a side of the molded under-fill 1218 opposite to the base substrate 1208. Other components, encapsulations, and semiconductor devices can be mounted to the under-fill top side 1220.

The base package 1202 can include a substrate contact extender 1222, which is defined as a vertical electrical connector. The substrate contact extender 1222 can be formed completely through the molded under-fill 1218 for providing an electrical connection between the substrate component contact 1211 of the base substrate 1208 and the under-fill top side 1220 of the molded under-fill 1218.

The substrate contact extender 1222 can be formed by forming a hole through the molded under-fill 1218 using laser drilling, laser ablation, or etching. The hole formed through the molded under-fill 1218 can have a diameter at a top end of 300-600 um and a bottom end with the diameter of 100-300 um.

The hole in the molded under-fill 1218 is filled with a conductive material to form the substrate contact extender 1222. The substrate contact extender 1222 can be exposed from the molded under-fill 1218 at the under-fill top side 1220.

The base package 1202 can include a chip contact extender 1223, which is defined as a vertical electrical connector. The chip contact extender 1223 can be formed completely through the molded under-fill 1218 for providing an electrical connection between the base integrated circuit 1210 and the under-fill top side 1220 of the molded under-fill 1218.

The chip contact extender 1223 can be formed by forming a hole through the molded under-fill 1218 using laser drilling, laser ablation, or etching. The hole formed through the molded under-fill 1218 can have a diameter at a top end of 300-600 um and a bottom end with the diameter of 100-300 um.

The hole in the molded under-fill 1218 is filled with a conductive material to form the substrate contact extender 1222. The chip contact extender 1223 can be exposed from the molded under-fill 1218 at the under-fill top side 1220. The chip contact extender 1223 can be formed on a non-periphery are of the base active side 1212 of the base integrated circuit 1210.

The chip contact extender 1223 can be spaced apart from another of the chip contact extender 1223 having a pitch between 200-500 um. The chip contact extender 1223 can be formed in a cone shape but the chip contact extender 1223 can also be formed in a cylinder shape.

The base package 1202 can include an intermediate integrated circuit 1221, which is defined as an integrated circuit having active circuitry fabricated thereon. The intermediate integrated circuit 1221 can be mounted on the molded under-fill 1218 and can have another package mounted thereover.

The intermediate integrated circuit 1221 can be an intermediate flip chip 1224. The intermediate flip chip 1224 can be mounted over the chip contact extender 1223. The intermediate flip chip 1224 can include an intermediate interconnect 1225, which is defined as an electrical connector for connecting the intermediate flip chip 1224 to the base integrated circuit 1210. The intermediate interconnect 1225 can be a solder ball, a solder dot, a solder bump, or other conductive structure. The intermediate interconnect 1225 can be attached between the chip contact extender 1223 and an active side of the intermediate flip chip 1224.

The base package 1202 can include an intermediate under-fill 1226, which is defined as a curable liquid under-fill material at room temperature that is cured to form a solid for hermetically sealing integrated circuits and semiconductor structures. For example, the intermediate under-fill 1226 can be a material that is liquid at room temperature and curable by heat or ultra-violet light to form a solid.

The intermediate under-fill 1226 can provide mechanical and environmental protection for the intermediate flip chip 1224. The intermediate under-fill 1226 can encapsulate the intermediate interconnect 1225 and between an active side of the intermediate flip chip 1224 and a non-periphery portion of the under-fill top side 1220.

A coupling connector 1230 is defined as a conductive structure for providing an electrical connection. The coupling connector 1230 can be used to mount a stack device 1205 to the substrate contact extender 1222. The coupling connector 1230 can be a solder ball, a solder dot, a solder bump, or other conductive structure.

The coupling connector 1230 can provide an electrical connection path between the stack device 1205 and the base substrate 1208, a stack integrated circuit 1242, the base integrated circuit 1210, the intermediate flip chip 1224, the base substrate 1208, the system interconnect 1204, or a combination thereof. The height of the coupling connector 1230 provides a separation between the backside of the intermediate flip chip 1224 and a stack substrate 1240.

The stack device 1205 is defined as integrated circuit package or integrated circuit die that is mounted over the base package 1202. The stack device 1205 can be a separate discreet integrated circuit package including the stack substrate 1240, the stack integrated circuit 1242, and a stack encapsulation 1244. The stack device 1205 can be mounted on the coupling connector 1230 for attaching the stack device 1205 to the base package 1202. The stack device 1205 can be suspended over the intermediate flip chip 1224 because the coupling connector 1230 provides a clearance space between the stack device 1205 and the intermediate flip chip 1224.

The stack substrate 1240 provides support and connectivity for other components and devices. The stack substrate 1240 can include conductive layers and conductive traces embedded therein. The stack substrate 1240 can be mounted on the coupling connector 1230.

The stack integrated circuit 1242 is mounted over the stack substrate 1140. For illustrative purposes, the stack integrated circuit 1242 can be a wire-bonded chip although the stack integrated circuit 1242 can also be a flip chip. The stack integrated circuit 1242 can be mounted to the stack substrate 1240 with an adhesive layer. The stack integrated circuit 1242 can be electrically coupled to the stack substrate 1240 by a bond wire.

The stack device 1205 can include the stack encapsulation 1244, which is defined as a cover for hermetically sealing components from the environment. The stack encapsulation 1244 can include an epoxy molding compound (EMC), polymide compound, or a wire-in-film (WIF) encapsulation. The stack encapsulation 1244 is different from the molded under-fill 1218 because the stack encapsulation 1244 is not a room temperature liquid when applied to the stack device and cured to form a solid. The stack encapsulation 1244 can encapsulate the stack integrated circuit 1242 on the stack substrate 1240.

Further, it has been discovered that the stack device 1205 with the coupling connector 1230 attached to the substrate contact extender 1222 formed through the molded under-fill 1218 provides for interchangeable packages to be mounted to the base package 1202. The placement of the substrate contact extender 1222 and the coupling connector 1230 make various package-on-package, Fan-in package-on-package, and package-in-package structures available without making changes to the base package 1202. For example, the stack device 1205, such as a top integrated circuit package can be mounted on the coupling connector 1230 for fabricating a package-on-package structure.

Figure 13:
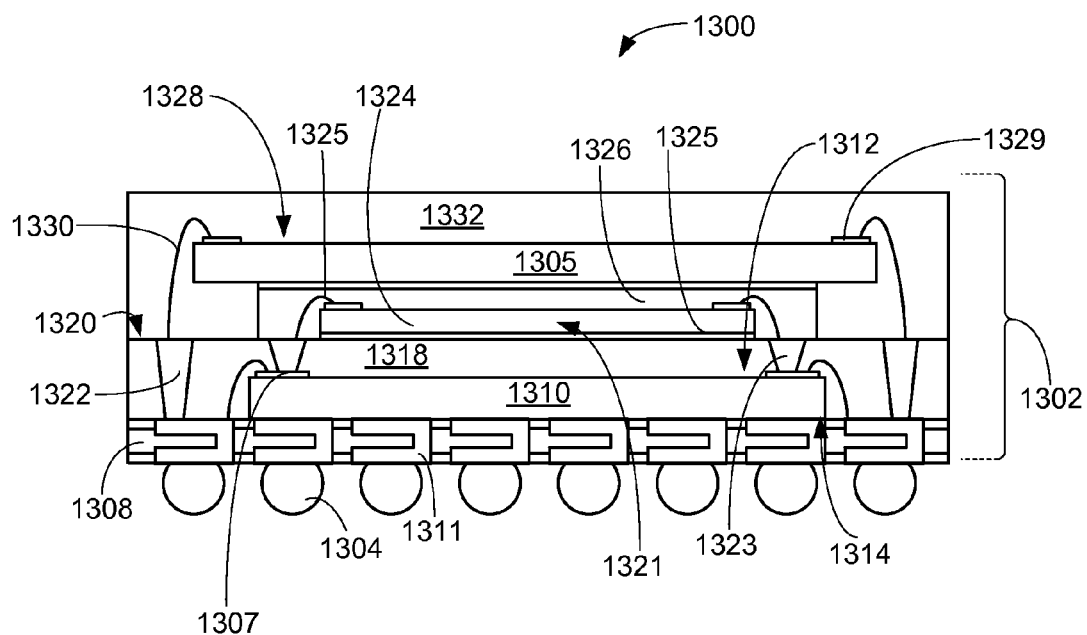
FIG. 13 is a cross-sectional view of an integrated circuit packaging system exemplified by the bottom view along line 1-1 of FIG. 2 in a fifth embodiment of the present invention.

Referring now to FIG. 13, therein is shown a cross-sectional view of an integrated circuit packaging system 1300 exemplified by the bottom view along line 1-1 of FIG. 2 in a fifth embodiment of the present invention. The integrated circuit packaging system 1300 can be similar to the integrated circuit packaging system 1000 of FIG. 10 except the integrated circuit packaging system 1300 includes a wire-bonded chip instead of the intermediate flip chip 1024 of FIG. 10.

A base package 1302 can include a base substrate 1308 and a base integrated circuit 1310 and an encapsulation for providing structural support and environmental protection for an integrated circuit. The base substrate 1308 is defined as a structure that provides support and connectivity for other components and devices. The base substrate 1308 can include conductive layers and conductive traces embedded therein.

The base integrated circuit 1310 is defined as an integrated circuit having active circuitry fabricated thereon. For illustrative purposes, the base integrated circuit 1310 is depicted as a wire-bonded chip although the base integrated circuit 1310 can also be a flip chip. The base integrated circuit 1310 can be mounted to the base substrate 1308 using an adhesive layer. The base integrated circuit 1310 can have a base active side 1312 with active circuitry fabricated thereon and a base inactive side 1314 opposite to the base active side 1312.

The base integrated circuit 1310 can include a base stack bond pad 1307. The base stack bond pad 1307 can be on the perimeter of the base active side 1312. Wire bonds and other conductive structures can be attached to the base stack bond pad 1307 for forming an electrical connection path to the base integrated circuit 1310.

A system interconnect 1304 is defined as an electrical connector providing direct electrical and mechanical connection to the next system level (not shown). As an example, the system interconnect 1304 can be a solder ball, a solder pillar, or a conductive bump. The system interconnect 1304 can be attached to the base substrate 1308. The system interconnect 1304 can be used to attach the base package 1302 to a next level system.

The base substrate 1308 can include a substrate component contact 1311, which is defined as a conductive structure embedded within the base substrate 1308 and exposed from the base substrate 1308 on a side opposite to the side attached to the system interconnect 1304. The substrate component contact 1311 can provide an electrical connection between the system interconnect 1304 and components that are mounted over the base substrate 1308.

The base package 1302 can include a molded under-fill 1318, which is defined as a curable liquid under-fill material at room temperature that is cured to form a solid for hermetically sealing integrated circuits and semiconductor structures. For example, the molded under-fill 1318 can be a material that is liquid at room temperature and curable by heat or ultra-violet light to form a solid.

The molded under-fill 1318 can provide mechanical and environmental protection for the base package 1302. The molded under-fill 1318 can be formed on a side of the base substrate 1308 opposite to the system interconnect 1304 and can encapsulate the base active side 1312 of the base integrated circuit 1310, and the vertical sidewalls of the base integrated circuit 1310.

The molded under-fill 1318 can include an under-fill top side 1320, which is a side of the molded under-fill 1318 opposite to the base substrate 1308. Other components, encapsulations, and semiconductor devices can be mounted to the under-fill top side 1320.

The base package 1302 can include a substrate contact extender 1322, which is defined as a vertical electrical connector. The substrate contact extender 1322 can be formed completely through the molded under-fill 1318 for providing an electrical connection between the substrate component contact 1311 of the base substrate 1308 and the under-fill top side 1320 of the molded under-fill 1318.

The substrate contact extender 1322 can be formed by forming a hole through the molded under-fill 1318 using laser drilling, laser ablation, or etching. The hole formed through the molded under-fill 1318 can have a diameter at a top end of 300-600 um and a bottom end with the diameter of 100-300 um.

The hole in the molded under-fill 1318 is filled with a conductive material to form the substrate contact extender 1322. The substrate contact extender 1322 can be exposed from the molded under-fill 1318 at the under-fill top side 1320. The substrate contact extender 1322 can be formed in a cone shape but the substrate contact extender 1322 can also be formed in a cylinder shape.

The base package 1302 can include a chip contact extender 1323, which is defined as a vertical electrical connector. The chip contact extender 1323 can be formed completely through the molded under-fill 1318 for providing an electrical connection between the base integrated circuit 1310 and the under-fill top side 1320 of the molded under-fill 1318.

The chip contact extender 1323 can be formed by forming a hole through the molded under-fill 1318 by laser drilling, laser ablation, or etching. The hole formed through the molded under-fill 1318 can have a diameter at a top end of 300-600 um and a bottom end with the diameter of 100-300 um. The hole in the molded under-fill 1318 is filled with a conductive material to form the chip contact extender 1323.

The chip contact extender 1323 can be exposed from the molded under-fill 1318 at the under-fill top side 1320. The chip contact extender 1323 can be formed on a periphery of the base active side 1312 of the base integrated circuit 1310.

The base package 1302 can include an intermediate integrated circuit 1321, which is defined as an integrated circuit having active circuitry fabricated thereon. The intermediate integrated circuit 1321 can be mounted on the molded under-fill 1318 and can have another package mounted thereover.

The intermediate integrated circuit 1321 can be an intermediate wire-bonded chip 1324 mounted above the chip contact extender 1323. The intermediate wire-bonded chip 1324 can include an intermediate interconnect 1325, which is defined as an electrical connector for connecting the intermediate wire-bonded chip 1324 to the base integrated circuit 1310. The intermediate interconnect 1325 can be a wire bond. The intermediate interconnect 1325 can be attached from the chip contact extender 1323 to a contact pad on an active side of the intermediate wire-bonded chip 1324.

The base package 1302 can include an intermediate encapsulation 1326, which is defined as a cover for hermetically sealing components. The base package 1302 encapsulates the intermediate wire-bonded chip 1324. The intermediate encapsulation 1326 can include an epoxy molding compound (EMC), polymide compound, or a wire-in-film (WIF) encapsulation. The intermediate encapsulation 1326 is different from the molded under-fill 1318 because the intermediate encapsulation 1326 is not a room temperature liquid when applied to the stack device and cured to form a solid. The intermediate encapsulation 1326 can encapsulate a non-periphery portion of the under-fill top side 1320, a top surface of the chip contact extender 1323, the intermediate interconnect 1325, and the intermediate wire-bonded chip 1324.

A stack device 1305 is defined as an integrated circuit die or integrated circuit package that is mounted over the base package 1302. The stack device 1305 can be mounted on the molded under-fill 1318 and electrically coupled to the substrate contact extender 1322. The stack device 1305 can be a wire-bonded integrated circuit. The stack device 1305 can be mounted over the intermediate wire-bonded chip 1324 with an adhesive layer.

The stack device 1305 can include a stack top side 1328, which is a side of the stack device 1305 facing opposite to the base substrate 1308. Components, interconnects, substrates, and devices can be mounted on the stack top side 1328.

The stack device 1305 can include a bond pad 1329 on the stack top side 1328. The bond pad 1329 can be on the perimeter of the stack top side 1328 of the stack device 1305 for attaching a coupling connector 1330 thereon.

The base package 1302 can include the coupling connector 1330, which is defined as a conductive structure for providing an electrical connection. The coupling connector 1330 can provide an electrical connection path between the substrate contact extender 1322 and the stack device 1305. The coupling connector 1330 can be a wire bond although the coupling connector 1330 can also be solder balls, solder dots, solder bumps, wire bonds, or other conductive structures.

The coupling connector 1330 can be attached from the substrate contact extender 1322 to the bond pad 1329. The coupling connector 1330 can provide an electrical connection path between the stack device 1305 and the system interconnect 1304, the base substrate 1308, the base integrated circuit 1310, the intermediate wire-bonded chip 1324, or a combination thereof.

The base package 1302 can include a base encapsulation 1332, which is defined as a cover for hermetically sealing components from the environment. The base encapsulation 1332 can include an epoxy molding compound (EMC), polymide compound, or a wire-in-film (WIF) encapsulation. The base encapsulation 1332 is different from the molded under-fill 1318 because the base encapsulation 1302 is not liquid at room temperature when applied to the base integrated circuit 1310 and cured to form a solid. The base encapsulation 1332 can encapsulate and be on the under-fill top side 1320 of the molded under-fill 1318, the coupling connector 1330, the intermediate encapsulation 1326, the bond pad 1329, and the stack device 1305.

It has been discovered that the stack device 1305 with the coupling connector 1330 attached to the substrate contact extender 1322 formed through the molded under-fill 1318 provides the benefit of direct stacking without a further solder bump level which reduces package profile and process steps.

The stack device 1305 can be directly mounted on the intermediate wire-bonded chip 1324 on the molded under-fill 1318 for a lower package profile. The coupling connector 1330 and the substrate contact extender 1322 provide a direct and low profile electrical connection between the base substrate 1308 and the stack top side 1328 of the stack device 1305.

Further, it has been discovered that the stack device 1305 coupled to the substrate contact extender 1322 by the coupling connector 1330 provides for interchangeable packages to be mounted to the base package 1302. The placement of the substrate contact extender 1322 and the coupling connector 1330 make various package-on-package, Fan-in package-on-package, and package-in-package structures available without making changes to the base package 102. For example, the base encapsulation 1332 can encapsulate the stack device 1305 mounted on the molded under-fill 1318 for fabricating a package-in-package structure.

Figure 14:
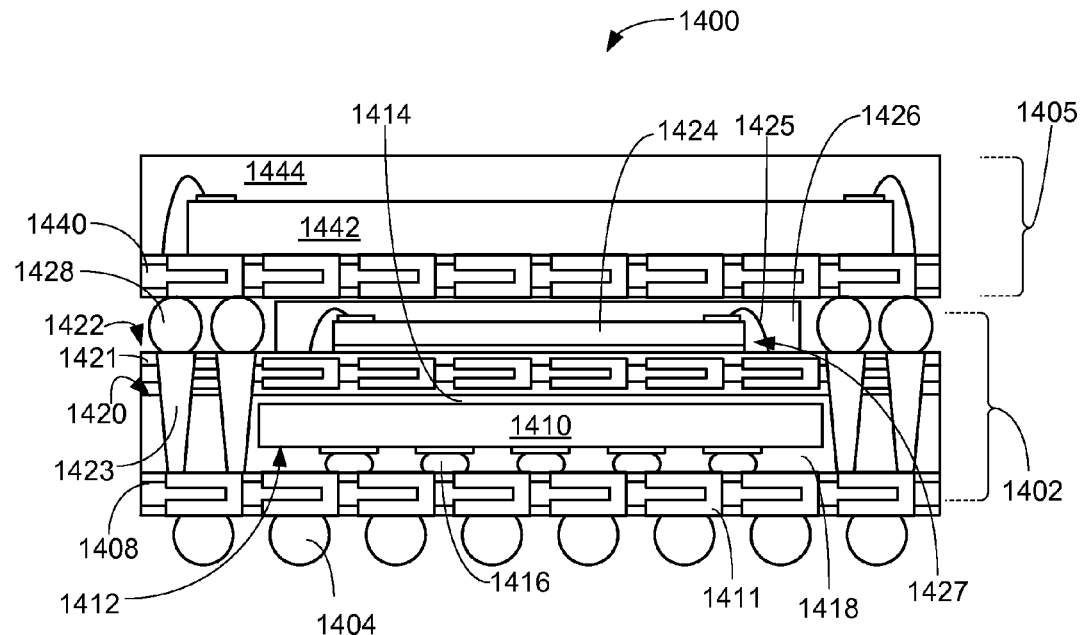
FIG. 14 is a cross-sectional view of an integrated circuit packaging system exemplified by the bottom view along line 1-1 of FIG. 2 in a sixth embodiment of the present invention.

Referring now to FIG. 14, therein is shown a cross-sectional view of an integrated circuit packaging system 1400 exemplified by the bottom view along line 1-1 of FIG. 2 in a sixth embodiment of the present invention. The integrated circuit packaging system 1400 can be similar to the integrated circuit packaging system 100 of FIG. 1 except the integrated circuit packaging system 1400 includes an additional substrate over the molded under-fill with a substrate contact extender through both the substrate and molded under-fill.

A base package 1402 can include a base substrate 1408 and a base integrated circuit 1410 and an encapsulation for providing structural support and environmental protection for an integrated circuit. The base substrate 1408 is defined as a structure that provides support and connectivity for other components and devices. The base substrate 1408 can include conductive layers and conductive traces embedded therein.

The base integrated circuit 1410 is defined as an integrated circuit having active circuitry fabricated thereon. For illustrative purposes, the base integrated circuit 1410 is depicted as a flip-chip although the base integrated circuit 1410 can also be a wire-bonded device. The base integrated circuit 1410 can have a base active side 1412 with active circuitry fabricated thereon and a base inactive side 1414 opposite to the base active side 1412.

A system interconnect 1404 is defined as an electrical connector providing direct electrical and mechanical connection to the next system level (not shown). As an example, the system interconnect 1404 can be a solder ball, a solder pillar, or a conductive bump. The system interconnect 1404 can be attached to the base substrate 1408. The system interconnect 1404 can be used to attach the base package 1402 to a next level system.

The base substrate 1408 can include a substrate component contact 1411, which is defined as a conductive structure embedded within the base substrate 1408 and exposed from the base substrate 1408 on a side opposite to the side attached to the system interconnect 1404. The substrate component contact 1411 can provide an electrical connection between the system interconnect 1404 and components that are mounted over the base substrate 1408.

The base package 1402 can include a base chip connector 1416. The base chip connector 1416 is defined as conductive structure for attaching and providing an electrical connection between an integrated circuit and a substrate. As an example, the base chip connector 1416 can be a solder ball, a solder pillar, a conductive bump, or other conductive structure.

The base package 1402 can include a molded under-fill 1418, which is defined as a curable liquid under-fill material at room temperature that is cured to form a solid for sealing integrated circuits and semiconductor structures. For example, the molded under-fill 1418 can be a material that is liquid at room temperature and curable by heat or ultra-violet light to form a solid.

The molded under-fill 1418 can provide mechanical and environmental protection for the base package 1402. The molded under-fill 1418 can be formed on the base substrate 1408 and encapsulate the base inactive side 1414 of the base integrated circuit 1410, the vertical sidewalls of the base integrated circuit 1410, the base active side 1412, and the base chip connector 1416.

The molded under-fill 1418 can include an under-fill top side 1420, which is a side of the molded under-fill 1418 opposite to the base substrate 1408. Other components, encapsulations, and semiconductor devices can be mounted to the under-fill top side 1420.

The base package 1402 can include an intermediate substrate 1421, which is defined as a structure that provides support and connectivity for other components and devices. The intermediate substrate 1421 can be mounted on the molded under-fill 1418. The intermediate substrate 1421 can include conductive layers and conductive traces embedded therein. The intermediate substrate 1421 can include a top mounting side 1422, which is a side of the intermediate substrate 1421 opposite to the base substrate 1408.

The base package 1402 can include a substrate contact extender 1423, which is defined as a vertical electrical connector. The substrate contact extender 1423 can be formed completely through the intermediate substrate 1421 and completely through the molded under-fill 1418 for providing an electrical connection between the substrate component contact 1411 of the base substrate 1408 and components or devices mounted on the top mounting side 1422.

The substrate contact extender 1423 can be formed by forming a hole through the intermediate substrate 1421 and the molded under-fill 1418 by laser drilling, laser ablation, or etching. The hole formed through the molded under-fill 1418 and the intermediate substrate 1421 can have a diameter at a top end of 300-600 um and a bottom end with the diameter of 100-300 um.

The hole in the molded under-fill 118 is filled with a conductive material to form the substrate contact extender 1423. A top surface of the substrate contact extender 1423 can be exposed from the intermediate substrate 1421 at the top mounting side 1422.

The substrate contact extender 1423 can be spaced apart from another of the substrate contact extender 1423 having a pitch between 200-500 um. The substrate contact extender 1423 can be formed in a cone shape but the substrate contact extender 1423 can also be formed in a cylinder shape.

The base package 1402 can include an intermediate integrated circuit 1427, which is defined as an integrated circuit having active circuitry fabricated thereon. The intermediate integrated circuit 1427 can be mounted on the intermediate substrate 1421 and can have another package mounted thereover.

The intermediate integrated circuit 1427 can be an intermediate wire-bonded chip 1424 mounted over the intermediate substrate 1421 and is under a stack device 1405. The intermediate wire-bonded chip 1424 can include an intermediate interconnect 1425, which is defined as an electrical connector for connecting the intermediate wire-bonded chip 1424 to the intermediate substrate 1421. The intermediate interconnect 1425 can be a wire bond connected to a contact pad on the intermediate wire-bonded chip 1424.

The base package 1402 can include an intermediate encapsulation 1426, which is defined as is defined as a cover for hermetically sealing components from the environment. The intermediate encapsulation 1426 encapsulates the intermediate wire-bonded chip 1424. The intermediate encapsulation 1426 can include an epoxy molding compound (EMC), polymide compound, or a wire-in-film (WIF) encapsulation. The intermediate encapsulation 1426 is different from the molded under-fill 1418 because the intermediate encapsulation 1426 is not a room temperature liquid when applied to the stack device 1405 and cured to form a solid. The intermediate encapsulation 1426 can encapsulate the intermediate wire-bonded chip 1424 and a non-periphery portion of the top mounting side 1422 of the intermediate substrate 1421.

The base package 1402 can include a coupling connector 1428, which is defined as a conductive structure for providing an electrical connection path between packages. The coupling connector 1428 can provide an electrical connection path between the substrate contact extender 1423 and the stack device 1405. The coupling connector 1428 can be a solder ball, although the coupling connector 1428 can also be a solder dot, a solder bump, a wire-bond, or other conductive structure. The coupling connector 1428 can be attached from the substrate contact extender 1423 to the stack device 1405.

The coupling connector 1428 can provide an electrical connection path between the stack device 1405 and the system interconnect 1404, the base substrate 1408, the base integrated circuit 1410, the intermediate wire-bonded chip 1424, a stack integrated circuit 1442, or a combination thereof. The height of the coupling connector 1428 provides a separation between the top side of the intermediate encapsulation 1426 and a stack substrate 1440.

The stack device 1405 is defined as integrated circuit package or integrated circuit die that is mounted over the base package 1402. The stack device 1405 can be a separate discreet integrated circuit package including the stack substrate 1440, the stack integrated circuit 1442, and a stack encapsulation 1444. The stack device 1405 can be mounted on the coupling connector 1428 for attaching the stack device 1405 to the base package 1402. The stack device 1405 can be suspended over the intermediate encapsulation 1426 because the coupling connector 1428 provides a clearance space between the stack device 1405 and the intermediate encapsulation 1426.

The stack substrate 1440 provides support and connectivity for other components and devices. The stack substrate 1440 can include conductive layers and conductive traces embedded therein. The stack substrate 1440 can be mounted on the coupling connector 1428.

The stack integrated circuit 1442 is mounted over the stack substrate 1440. For illustrative purposes, the stack integrated circuit 1442 can be a wire-bonded chip although the stack integrated circuit 1442 can also be a flip chip. The stack integrated circuit 1442 can be attached to the stack substrate 1440 by an adhesive layer. The stack integrated circuit 1442 can be electrically connected to the stack substrate 1440 by a bond wire.

The stack device 1405 can include a stack encapsulation 1444, which is defined as a cover for hermetically sealing components from the environment. The stack encapsulation 1444 can include an epoxy molding compound (EMC), polymide compound, or a wire-in-film (WIF) encapsulation. The stack encapsulation 1444 is different from the molded under-fill 1418 because the stack encapsulation 1444 is not a room temperature liquid when applied to the stack device and cured to form a solid. The stack encapsulation 1444 can encapsulate the stack integrated circuit 1442 on the stack substrate 1440.

It has been discovered that the stack device 1405 with the coupling connector 1428 attached to the substrate contact extender 1423 formed through the molded under-fill 1418 provides for interchangeable packages to be mounted to the base package 1402. The placement of the substrate contact extender 1423 and the coupling connector 1428 make various package-on-package, Fan-in package-on-package, and package-in-package structures available without making changes to the base package 1402. For example, the stack device 1405, such as a top integrated circuit package can be mounted on the coupling connector 1428 for fabricating a package-on-package structure.

Figure 15:
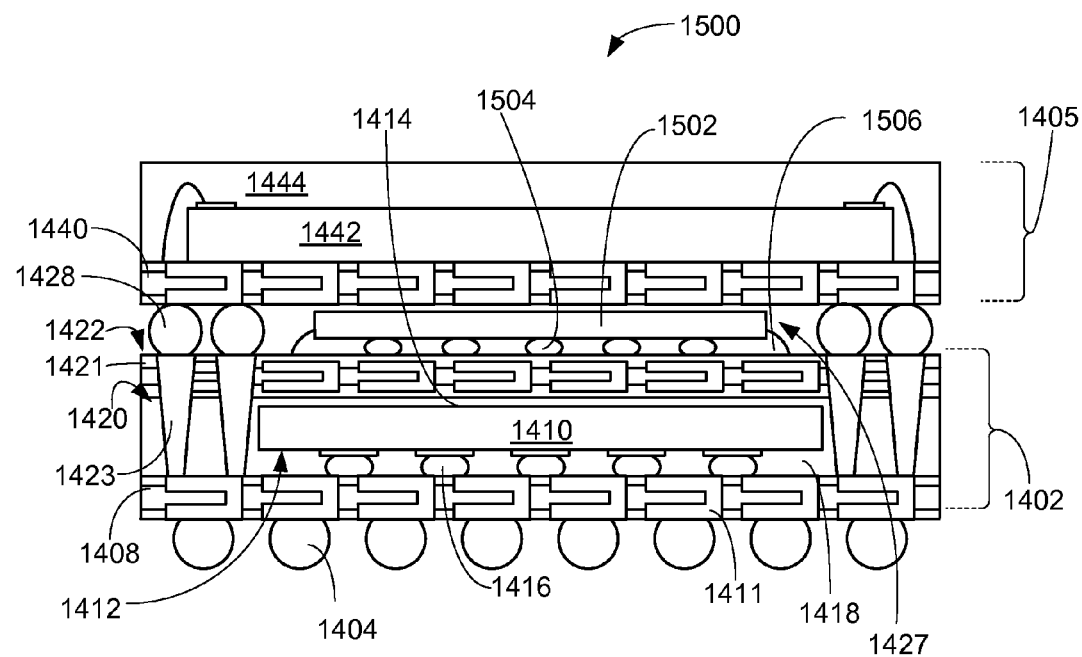
FIG. 15 is a cross-sectional view of an integrated circuit packaging system exemplified by the bottom view along line 1-1 of FIG. 2 in a seventh embodiment of the present invention.

Referring now to FIG. 15, therein is shown a cross-sectional view of an integrated circuit packaging system 1500 exemplified by the bottom view along line 1-1 of FIG. 2 in a seventh embodiment of the present invention. The integrated circuit packaging system 1500 can be similar to the integrated circuit packaging system 1400 of FIG. 14 except the integrated circuit packaging system 1500 can include a flip chip instead of the intermediate wire-bonded chip 1424 of FIG. 14.

The base package 1402 can include the base substrate 1408 and the base integrated circuit 1410 and an encapsulation for providing structural support and environmental protection for an integrated circuit. The base substrate 1408 is defined as a structure that provides support and connectivity for other components and devices. The base substrate 1408 can include conductive layers and conductive traces embedded therein.

The base integrated circuit 1410 is defined as an integrated circuit having active circuitry fabricated thereon. For illustrative purposes, the base integrated circuit 1410 is depicted as a flip-chip although the base integrated circuit 1410 can also be a wire-bonded device. The base integrated circuit 1410 can have the base active side 1412 with active circuitry fabricated thereon and the base inactive side 1414 opposite to the base active side 1412.

The system interconnect 1404 is defined as an electrical connector providing direct electrical and mechanical connection to the next system level (not shown). As an example, the system interconnect 1404 can be a solder ball, a solder pillar, or a conductive bump. The system interconnect 1404 can be attached to the base substrate 1408. The system interconnect 1404 can be used to attach the base package 1402 to a next level system.

The base substrate 1408 can include the substrate component contact 1411, which is defined as a conductive structure embedded within the base substrate 1408 and exposed from the base substrate 1408 on a side opposite to the side attached to the system interconnect 1404. The substrate component contact 1411 can provide an electrical connection between the system interconnect 1404 and components that are mounted over the base substrate 1408.

The base package 1402 can include the base chip connector 1416. The base chip connector 1416 is defined as conductive structure for attaching and providing an electrical connection between an integrated circuit and a substrate. As an example, the base chip connector 1416 can be a solder ball, a solder pillar, a conductive bump, or other conductive structure.

The base package 1402 can include the molded under-fill 1418, which is defined as a curable liquid under-fill material at room temperature that is cured to form a solid for sealing integrated circuits and semiconductor structures. For example, the molded under-fill 1418 can be a material that is liquid at room temperature and curable by heat or ultra-violet light to form a solid.

The molded under-fill 1418 can provide mechanical and environmental protection for the base package 1402. The molded under-fill 1418 can be formed on the base substrate 1408 and encapsulate the base inactive side 1414 of the base integrated circuit 1410, the vertical sidewalls of the base integrated circuit 1410, the base active side 1412, and the base chip connector 1416.

The molded under-fill 1418 can include the under-fill top side 1420, which is a side of the molded under-fill 1418 opposite to the base substrate 1408. Other components, encapsulations, and semiconductor devices can be mounted to the under-fill top side 1420.

The base package 1402 can include the intermediate substrate 1421, which is defined as a structure that provides support and connectivity for other components and devices. The intermediate substrate 1421 can be mounted on the molded under-fill 1418. The intermediate substrate 1421 can include conductive layers and conductive traces embedded therein. The intermediate substrate 1421 can include the top mounting side 1422, which is a side of the intermediate substrate 1421 opposite to the base substrate 1408.

The base package 1402 can include the substrate contact extender 1423, which is defined as a vertical electrical connector. The substrate contact extender 1423 can be formed completely through the intermediate substrate 1421 and completely through the molded under-fill 1418 for providing an electrical connection between the substrate component contact 1411 of the base substrate 1408 and components or devices mounted on the top mounting side 1422.

The substrate contact extender 1423 can be formed by forming a hole through the intermediate substrate 1421 and the molded under-fill 1418 by laser drilling, laser ablation, or etching. The hole formed through the molded under-fill 1418 and the intermediate substrate 1421 can have a diameter at a top end of 300-600 um and a bottom end with the diameter of 100-300 um.

The hole in the molded under-fill 118 is filled with a conductive material to form the substrate contact extender 1423. A top surface of the substrate contact extender 1423 can be exposed from the intermediate substrate 1421 at the top mounting side 1422.

The substrate contact extender 1423 can be spaced apart from another of the substrate contact extender 1423 having a pitch between 200-500 um. The substrate contact extender 1423 can be formed in a cone shape but the substrate contact extender 1423 can also be formed in a cylinder shape.

The intermediate integrated circuit 1427 can be an intermediate flip chip 1502 mounted over the intermediate substrate 1421. The intermediate flip chip 1502 can include an intermediate interconnect 1504, which is defined as an electrical connector. The intermediate interconnect 1504 can provide an electrical connection from the intermediate flip chip 1502 to the intermediate substrate 1421.

The intermediate interconnect 1504 can be a solder ball, a solder dot, a solder bump, or other conductive structure. The intermediate interconnect 1504 can be attached between the top mounting side 1422 and an active side of the intermediate flip chip 1502.

The intermediate flip chip 1502 can include an intermediate under-fill 1506, which is defined as a curable liquid under-fill material at room temperature that is cured to form a solid for hermetically sealing integrated circuits and semiconductor structures. For example, the intermediate under-fill 1506 can be a material that is liquid at room temperature and curable by heat or ultra-violet light to form a solid.

The intermediate under-fill 1506 can provide mechanical and environmental protection for the intermediate flip chip 1502. The intermediate under-fill 1506 can encapsulate the intermediate interconnect 1504 and between an active side of the intermediate flip chip 1502 and a non-periphery portion of the top mounting side 1422 of the intermediate substrate 1421.

The base package 1402 can include the coupling connector 1428, which is defined as a conductive structure for providing an electrical connection between packages. The coupling connector 1428 can provide an electrical connection between the substrate contact extender 1423 and the stack device 1405. The coupling connector 1428 can be a solder ball, although the coupling connector 1428 can also be a solder dot, a solder bump, a wire-bond, or other conductive structure. The coupling connector 1428 can be attached from the substrate contact extender 1423 to the stack device 1405.

The coupling connector 1428 can provide an electrical connection path between the stack device 1405 and the system interconnect 1404, the base substrate 1408, the base integrated circuit 1410, the intermediate wire-bonded chip 1424, the stack integrated circuit 1442, or a combination thereof. The height of the coupling connector 1428 provides a separation between the top side of the intermediate encapsulation 1426 and the stack substrate 1440.

The stack device 1405 is defined as integrated circuit package or integrated circuit die that is mounted over the base package 1402. The stack device 1405 can be a separate discreet integrated circuit package including the stack substrate 1440, the stack integrated circuit 1442, and the stack encapsulation 1444. The stack device 1405 can be mounted on the coupling connector 1428 for attaching the stack device 1405 to the base package 1402. The stack device 1405 can be suspended over the intermediate flip chip 1502 because the coupling connector 1428 provides a clearance space between the stack device 1405 and the intermediate flip chip 1502.

The stack substrate 1440 provides support and connectivity for other components and devices. The stack substrate 1440 can include conductive layers and conductive traces embedded therein. The stack substrate 1440 can be mounted on the coupling connector 1428.

The stack integrated circuit 1442 is mounted over the stack substrate 1440. For illustrative purposes, the stack integrated circuit 1442 can be a wire-bonded chip although the stack integrated circuit 1442 can also be a flip chip. The stack integrated circuit 1442 can be attached to the stack substrate 1440 by an adhesive layer. The stack integrated circuit 1442 can be electrically connected to the stack substrate 1440 by a bond wire.

The stack device 1405 can include the stack encapsulation 1444, which is defined as a cover for hermetically sealing components from the environment. The stack encapsulation 1444 can include an epoxy molding compound (EMC), polymide compound, or a wire-in-film (WIF) encapsulation. The stack encapsulation 1444 is different from the molded under-fill 1418 because the stack encapsulation 1444 is not a room temperature liquid when applied to the stack device and cured to form a solid. The stack encapsulation 1444 can encapsulate the stack integrated circuit 1442 on the stack substrate 1440.

It has been discovered that the stack device 1405 with the coupling connector 1428 attached to the substrate contact extender 1423 formed through the molded under-fill 1418 provides for interchangeable packages to be mounted to the base package 1402. The placement of the substrate contact extender 1423 and the coupling connector 1428 make various package-on-package, Fan-in package-on-package, and package-in-package structures available without making changes to the base package 1402. For example, the stack device 1405, such as a top integrated circuit package can be mounted on the coupling connector 1428 for fabricating a package-on-package structure.

Figure 16:
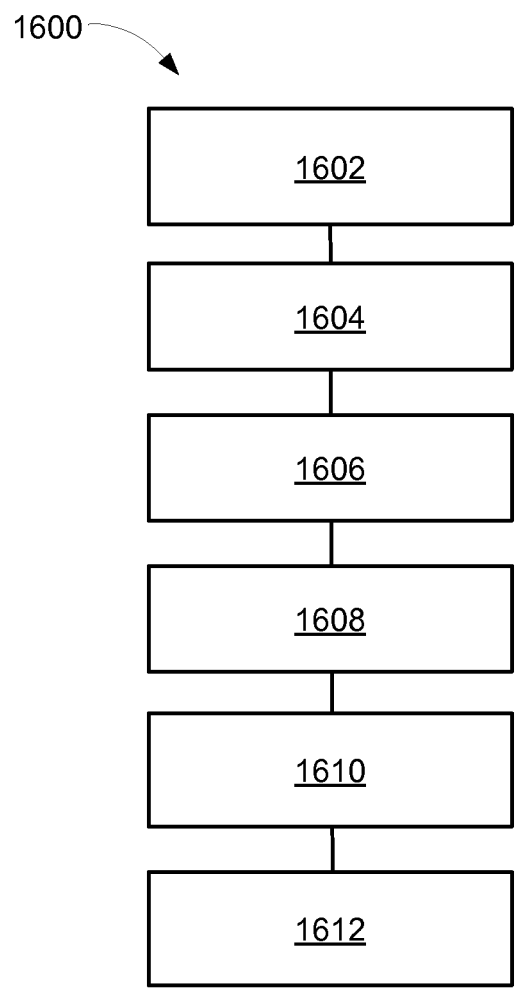
FIG. 16 is a flow chart of a method of manufacture of the integrated circuit packaging system in a further embodiment of the present invention.

Referring now to FIG. 16 therein is shown a flow chart of a method 1600 of manufacture of the integrated circuit packaging system 100 in a further embodiment of the present invention. The method 1600 includes: providing a base substrate in a block 1602; applying a molded under-fill on the base substrate in a block 1604; forming a substrate contact extender through the molded under-fill and in direct contact with the base substrate in a block 1606; mounting a stack device over the molded under-fill in a block 1608; attaching a coupling connector from the substrate contact extender to the stack device in a block 1610; and forming an encapsulation on the stack device, the substrate contact extender, and encapsulating the coupling connector in a block 1612.

Thus, it has been discovered that the integrated circuit packaging system of the present invention furnishes important and heretofore unknown and unavailable solutions, capabilities, and functional aspects for mold interlock. The resulting method, process, apparatus, device, product, and/or system is straightforward, cost-effective, uncomplicated, highly versatile and effective, can be surprisingly and non-obviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit packaging system comprising:
    a base substrate;
    a molded under-fill on the base substrate;
    a substrate contact extender formed through the molded under-fill and in direct contact with the base substrate, the substrate contact extender includes a cone shape;
    a stack device mounted over the molded under-fill;
    a coupling connector attached from the substrate contact extender to the stack device; and
    a base encapsulation formed on the stack device, the substrate contact extender, and encapsulating the coupling connector, wherein the base encapsulation is in direct contact with an under-fill top side of the molded under-fill.

2. The system as claimed in claim 1 wherein:
    the stack device includes a redistribution layer;
    the base encapsulation includes a cavity exposing the redistribution layer at a non-periphery portion of the stack device; and
further comprising:
    a package interconnect on the redistribution layer.

3. The system as claimed in claim 1 further comprising:
    a base integrated circuit on the base substrate;
    a chip contact extender through the molded under-fill and in direct contract with the base integrated circuit;
    an intermediate flip chip on the chip contact extender; and
wherein:
    the base encapsulation encapsulates the intermediate flip chip.

4. The system as claimed in claim 1 further comprising:
    a base integrated circuit having a base bond pad mounted on the base substrate;
    a chip contact extender through the molded under-fill and in direct contact with the base bond pad;
    an intermediate wire-bonded chip mounted over the molded under-fill;
    an intermediate interconnect attached from the chip contact extender to an active side of the intermediate wire-bonded chip; and
wherein:
    the base encapsulation encapsulates the intermediate wire-bonded chip.

* * * * *